(12) United States Patent
Ito

(10) Patent No.: US 7,384,132 B2
(45) Date of Patent: Jun. 10, 2008

(54) COMBINED CIRCUIT UNIT AND AN INKJET PRINTER

(75) Inventor: Koji Ito, Gifu (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 394 days.

(21) Appl. No.: 11/210,114

(22) Filed: Aug. 24, 2005

(65) Prior Publication Data

US 2006/0044355 A1    Mar. 2, 2006

(30) Foreign Application Priority Data

Aug. 24, 2004    (JP) .............................. 2004-244061

(51) Int. Cl.
  *B41J 2/045*    (2006.01)
  *H05K 1/00*    (2006.01)
(52) U.S. Cl. ........................ 347/68; 361/749
(58) Field of Classification Search ............ 347/58–59, 347/68–72, 148; 361/7, 18–19, 42, 117, 361/118, 718, 719, 749
See application file for complete search history.

(56) References Cited

U.S. PATENT DOCUMENTS

| 6,483,713 | B2 * | 11/2002 | Samant et al. .............. 361/749 |
| 6,885,535 | B2 * | 4/2005 | Hummert et al. ........... 361/118 |
| 2003/0156157 | A1 | 8/2003 | Suzuki et al. |

FOREIGN PATENT DOCUMENTS

JP    2003 311953    11/2003

* cited by examiner

*Primary Examiner*—Lamson Nguyen
(74) *Attorney, Agent, or Firm*—Banner & Witcoff, Ltd.

(57) ABSTRACT

A combined circuit unit is developed by combining a rigid printed circuit board and a flexible printed circuit film. The combined circuit unit is very compact in its shape, yet, maintains high cooling capability of an electronic circuit device. A driver IC that generates heat is mounted on the flexible printed circuit film. A heat dissipation region is formed within the rigid printed circuit board. The driver IC is wedged between the flexible printed circuit film and the rigid printed circuit board at the heat dissipation region. Heat generated by the driver IC is efficiently dissipated by the heat dissipation region to the exterior.

27 Claims, 17 Drawing Sheets (a)

(b)

COMBINED CIRCUIT UNIT AND AN INKJET PRINTER

CROSS-REFERENCE TO RELATED APPLICATION

This application claims priority to Japanese Patent Application No. 2004-244061, filed on Aug. 24, 2004, the contents of which are hereby incorporated by reference into the present application. The related technology is disclosed in co-pending U.S. application Ser. No. 11/167,288 filed on Jun. 28, 2005 by the common assignee, the contents of which are hereby incorporated by reference into the present application.

BACKGROUND OF THE INVENTION

1. Field of the Invention

The present invention relates to a combined circuit unit constructed by combining a flexible printed circuit film and a rigid printed circuit board. The present invention also relates to an inkjet printer.

2. Description of the Related Art

An inkjet head used in an inkjet printer distributes ink supplied from an ink tank to a plurality of pressure chambers, pushes out the ink from a selected pressure chamber by applying pressure to the selected pressure chamber, and discharges the ink pushed out from the selected pressure chamber from a corresponding nozzle. The nozzle that discharges the ink can be selected by selecting the pressure chamber to which the pressure is applied. An actuator unit utilizing a piezoelectric sheet made from piezoelectric ceramics is used to apply pressure to any pressure chamber that may be arbitrarily selected from the pressure chambers.

One example of an inkjet head is described in Japanese Laid-Open Patent Application Publication No. 2003-311953. An actuator unit described in the publication uses a piezoelectric sheet that straddles and extends across a plurality of pressure chambers, a common electrode spreading out on one surface of the piezoelectric sheet, and a plurality of individual electrodes formed on the other surface of the piezoelectric sheet. Each of the individual electrodes is disposed to face each of the individual pressure chambers.

A plurality of individual electrodes dispersed on the surface of the piezoelectric sheet is electrically connected to a driver IC through a plurality of wiring patterns formed on a flexible printed circuit film. The driver IC is mounted on a surface of the flexible printed circuit film. The driver IC selects any individual electrode from the plurality of individual electrodes and applies a driving voltage to the selected individual electrode. When the driving voltage is applied to the selected individual electrode, the thickness of the piezoelectric sheet in the location that corresponds to the selected individual electrode changes by a so-called piezoelectric longitudinal effect. Accordingly, the volume of the pressure chamber that corresponds to the selected individual electrode changes, and the ink is discharged from a nozzle linked to that pressure chamber. The flexible printed circuit film is frequently abbreviated as FPC. This specification will follow this common notation and refer to the flexible printed circuit film as FPC. The "Printed" included in the abbreviation FPC means that a wiring pattern is formed, and it is not limited to those with wiring patterns formed by a method of "Print."

In the recent years, higher resolution of inkjet heads is being desired. When an attempt is made to seek higher resolution by increasing the density of nozzles, the densities of pressure chambers and individual electrodes also increase. Consequently, the number of individual electrodes increases. Along with this, the heat release value generated by the driver IC also increases. An active site of the actuator unit operates electrically as a capacitive load such as a condenser, and consumes energy proportional to the product of the capacitance, the square of a driving voltage, and a driving cycle. As energy consumed by the actuator unit increases, energy consumed by the driver IC also increases. If the driver IC is overheated, the inkjet head is overheated and the discharge property of the ink varies. Sufficient printing quality cannot be obtained.

To handle this problem, an inkjet head described in Japanese Laid-Open Patent Application Publication No. 2003-311953 provides a large-scale heat sink, and pushes a driver IC to the heat sink by an elastic member such as a sponge. By doing so, heat generated from the driver IC is transferred to the heat sink, and the heat is dissipated to the exterior (such as into the atmosphere).

BRIEF SUMMARY OF THE INVENTION

However, an inkjet head described in Japanese Laid-Open Patent Application Publication No. 2003-311953 requires a heat sink that only bears a single function, namely heat dissipation. The size of the inkjet head becomes larger because a large-scale heat sink is required in order to guarantee sufficient heat dissipation capability. In addition, the volume for the elastic member such as the sponge is also required, which further enlarges the inkjet head.

An objective of the present invention is to realize the miniaturization of a combined circuit unit with a built-in electronic circuit device, such as a driver IC, while maintaining the heat dissipating capability of the built-in electronic circuit device.

One objective of the present invention is to provide a compact size combined circuit unit that has a high heat dissipating capability.

Another objective of the present invention is to provide an inkjet printer that has a high heat dissipating capability and has a discharge property of ink that is unlikely to vary.

According to one aspect of the present invention, a combined circuit unit is created. The combined circuit unit comprises a flexible printed circuit film and a rigid printed circuit board. The flexible printed circuit film comprises a first electronic circuit device mounted on a surface of the flexible printed circuit film and first terminals formed at end portions of wirings connected to the first electronic circuit device. The rigid printed circuit board comprises a second electronic circuit device mounted on a surface of the rigid printed circuit board, second terminals formed at end portions of wirings connected to the second electronic circuit device, and a heat dissipation region. The heat dissipation region has higher heat dissipation efficiency than the surrounding area within the rigid printed circuit board (area of the rigid printed circuit board other than the heat dissipation region). The combined circuit unit provides the following characteristics: the first terminals and the second terminals are electrically connected; and the first electronic circuit device is thermally coupled to the heat dissipation region.

According to the combined circuit unit described above, heat generated by the first electronic circuit device can be dissipated through the heat dissipation region of the rigid printed circuit board. Accordingly, there is no need to incorporate a heat sink that has only a single function, namely heat dissipation. The combined circuit unit can be downsized because the heat sink and elastic member, both of which had been required for prior art, become unnecessary.

By utilizing the combined circuit unit mentioned above, an inkjet printer with high heat dissipation capability and with discharge property of the ink that is unlikely to vary can be provided.

This inkjet printer, according to one aspect of the invention, comprises an inkjet head, a flexible printed circuit film, and a rigid printed circuit board. The inkjet head comprises a flow channel unit and a plurality of actuators. The flow channel unit comprises a common ink chamber, a plurality of pressure chambers, a plurality of nozzles, and a plurality of ink flow channels, wherein each ink flow channel reaches a single nozzle from the common ink chamber through a single pressure chamber. Each of the actuators gives discharge energy to the ink within each of the pressure chambers. The flexible printed circuit film comprises a driver IC which is mounted on a surface of the flexible printed circuit film and which generates signals to supply to the actuators. The flexible printed circuit film further comprises first terminals formed at end portions of wirings connected to the driver IC and the actuators. The rigid printed circuit board comprises a second electronic circuit device mounted on a surface of the rigid printed circuit board, second terminals formed at end portions of wirings connected to the second electronic circuit device, and a heat dissipation region. The heat dissipation region has higher heat dissipation efficiency than the surrounding area within the rigid printed circuit board. The inkjet printer provides the following characteristics: the first terminals and the second terminals are electrically connected; and the driver IC is thermally coupled to the heat dissipation region.

Since the inkjet printer described above does not need to incorporate a heat sink designed exclusively for heat dissipation, the inkjet head can be downsized. Furthermore, the heat dissipation capability of the inkjet head is high, and the discharge property of the ink is unlikely to vary. A high-quality, compact size inkjet printer can be realized.

Two flexible printed circuit films may be combined with a single rigid printed circuit board.

The combined circuit unit, according to this aspect, comprises a front flexible printed circuit film, a back flexible printed circuit film, and a rigid printed circuit board. The front flexible printed circuit film comprises a first front electronic circuit device mounted on a surface of the front flexible printed circuit film and first front terminals formed at end portions of wirings connected to the first front electronic circuit device. The back flexible printed circuit film comprises a first back electronic circuit device mounted on a surface of the back flexible printed circuit film and first back terminals formed at end portions of wirings connected to the first back electronic circuit device. The rigid printed circuit board comprises a second electronic circuit device mounted on a surface of the rigid printed circuit board, and second front terminals formed at end portions of wirings connected to the second electronic circuit device. The second front terminals are formed on a surface of the rigid printed circuit board facing the front flexible printed circuit film. The rigid printed circuit board further comprises second back terminals formed at end portions of wirings connected to the second electronic circuit device. The second back terminals are formed on a surface of the rigid printed circuit board facing the back flexible printed circuit film. The rigid printed circuit board further comprises a heat dissipation region that has higher heat dissipation efficiency than the surrounding area within the rigid printed circuit board. The combined circuit unit provides the following characteristics: the first front terminals and the second front terminals are electrically connected; the first back terminals and the second back terminals are electrically connected; the first front electronic circuit device is thermally coupled to the heat dissipation region; and the first back electronic circuit device is thermally coupled to the heat dissipation region. A range in which the first front electronic circuit device is thermally coupled to the heat dissipation region and a range in which the first back electronic circuit device is thermally coupled to the heat dissipation region do not overlap in-plane of the rigid printed circuit board.

In order to dissipate heat generated from the first front electronic circuit device and the first back electronic circuit device by utilizing the rigid printed circuit board, it is imperative that the range in which the first front electronic circuit device is thermally coupled to the rigid printed circuit board and the range in which the first back electronic circuit device is thermally coupled to the rigid printed circuit board do not overlap. By disposing the first front electronic circuit device and the first back electronic circuit device so as not to overlap, the combined circuit unit which can effectively dissipate heat generated by a plurality of electronic circuit devices through the rigid printed circuit board can be facilitated.

By utilizing the combined circuit unit mentioned above, an inkjet printer with high heat dissipation capability and with discharge property of the ink that is unlikely to vary can be provided.

This inkjet printer, according to one aspect of the invention, comprises the inkjet head and the combined circuit unit. The inkjet head comprises a flow channel unit and a plurality of actuators. The flow channel unit comprises a common ink chamber, a plurality of pressure chambers, a plurality of nozzles, and a plurality of ink flow channels, wherein each ink flow channel reaches a single nozzle from the common ink chamber through a single pressure chamber. Each of the actuators gives discharge energy to the ink within each of the pressure chambers. The combined circuit unit comprises a front flexible printed circuit film, a back flexible printed circuit film, and a rigid printed circuit board. The front flexible printed circuit film comprises a front driver IC which is mounted on a surface of the front flexible printed circuit film and which generates signals to supply to the actuators. The front flexible printed circuit film further comprises first front terminals formed at end portions of wirings connected to the actuators and the front driver IC. The back flexible printed circuit film comprises a back driver IC which is mounted on a surface of the back flexible printed circuit film and which generates signals to supply to the actuators. The back flexible printed circuit film further comprises first back terminals formed at end portions of wirings connected to the actuators and the back driver IC. The rigid printed circuit board comprises a second electronic circuit device mounted on a surface of the rigid printed circuit board and second front terminals formed at end portions of wirings connected to the second electronic circuit device, wherein second front terminals are formed on a surface of the rigid printed circuit board facing the front flexible printed circuit film. The rigid printed circuit board also comprises second back terminals formed at end portions of wirings connected to the second electronic circuit device, wherein second back terminals are formed on a surface of the rigid printed circuit board facing the back flexible printed circuit film. The rigid printed circuit board also comprises a heat dissipation region having higher heat dissipation efficiency than the surrounding area. The inkjet printer provides the following characteristics: the first front terminals and the second front terminals are electrically connected; the first back terminals and the second back terminals are electrically connected; the front driver IC is thermally coupled to the heat dissipation region; and the back driver IC is thermally coupled to the heat dissipation region. A range in which the front driver IC is thermally coupled to the heat dissipation region and a range in which the back driver IC is thermally coupled to the heat dissipation region do not overlap in-plane of the rigid printed circuit board.

Since the inkjet printer described above does not need to adopt a heat sink designed exclusively for heat dissipation, the inkjet head can be downsized. While providing a plurality of driver ICs, the heat dissipation capability of the inkjet head is high, and the discharge property of the ink is unlikely to vary. A high-quality, compact size inkjet printer can be realized.

A rigid printed circuit board may provide a plurality of electronic circuit devices. The rigid printed circuit board in this case comprises: a second front electronic circuit device mounted on a surface of the rigid printed circuit board; second front terminals formed at end portions of wirings connected to the second front electronic circuit device, wherein the second front terminals are formed on a surface of the rigid printed circuit board facing the front flexible printed circuit film; a second back electronic circuit device mounted on the surface of the rigid printed circuit board; and second back terminals formed at end portions of wirings connected to the second back electronic circuit device, wherein the second back terminals are formed on a surface of the rigid printed circuit board facing the back flexible printed circuit film. The rigid printed circuit board further includes a heat dissipation region.

By utilizing the combined circuit unit mentioned above, an inkjet printer with high heat dissipation capability and with discharge property of the ink that is unlikely to vary can be provided.

This inkjet printer utilizes the rigid printed circuit board, wherein the second front electronic circuit device and the second back electronic circuit device are fixed on it.

Since the inkjet printer described above does not need to mount a heat sink designed exclusively for heat dissipation, the inkjet head can be downsized. While providing a plurality of driver ICs, the heat dissipation capability of the inkjet head is high, and the discharge property of the ink is unlikely to vary. A high-quality, compact size inkjet printer can be realized.

A rigid printed circuit board may be constructed by combining a plurality of rigid printed circuit boards.

A combined circuit unit, in this aspect, comprises a flexible printed circuit film, a first rigid printed circuit board, and a second rigid printed circuit board. The flexible printed circuit film comprises a first electronic circuit device mounted on a surface of the flexible printed circuit film and first terminals formed at end portions of wirings connected to the first electronic circuit device. The first rigid printed circuit board comprises wirings connecting second terminals and third terminals formed on a surface of the first rigid printed circuit board and a beat dissipation region. The second rigid printed circuit board comprises a second electronic circuit device mounted on a surface of the second rigid printed circuit board, and fourth terminals formed at end portions of wirings connected to the second electronic circuit device. The second rigid printed circuit board is bigger than the first rigid printed circuit board. The combined circuit unit provides the following characteristics: the first terminals and the second terminals are electrically connected; the third terminals and the fourth terminals are electrically connected; and the first electronic circuit device is thermally coupled to the heat dissipation region.

With the combined circuit unit above, heat generated by the first electronic circuit device can be dissipated through the heat dissipation region of the first rigid printed circuit board. Accordingly, there is no need to incorporate a heat sink designed exclusively for heat dissipation. The miniaturization of the combined circuit unit can be realized. In addition, since the heat dissipation region is formed on the first rigid printed circuit board, when heat generated by the first electronic circuit device is dissipated through the heat dissipation region, it is unlikely for the heat to give adverse effects to the second electronic circuit device fixed on the second rigid printed circuit board.

By utilizing the combined circuit unit mentioned above, an inkjet printer with high heat dissipation capability and with discharge property of the ink that is unlikely to vary can be provided.

The inkjet printer of this aspect comprises the inkjet head and the combined circuit unit. The combined circuit unit comprises a flexible printed circuit film, a first rigid printed circuit board, and a second rigid printed circuit board. The flexible printed circuit film comprises a driver IC which is mounted on a surface of the flexible printed circuit film and which generates signals to supply to the actuators. The flexible printed circuit film also includes first terminals formed at end portions of wirings connected to the driver IC and the actuators. The first rigid printed circuit board comprises wirings connecting second terminals and third terminals formed on a surface of the first rigid printed circuit board. The first rigid printed circuit board also includes a heat dissipation region. The second rigid printed circuit board comprises a second electronic circuit device mounted on a surface of the second rigid printed circuit board, and fourth terminals formed at end portions of wirings connected to the second electronic circuit device. The second rigid printed circuit board is bigger than the first rigid printed circuit board. The combined circuit unit provides the following characteristics: the first terminals and the second terminals are electrically connected; the third terminals and the fourth terminals are electrically connected; and the driver IC is thermally coupled to the heat dissipating region.

As a result, heat generated by the driver IC can be dissipated through the heat dissipation region of the first rigid printed circuit board. Accordingly, there is no need to incorporate a heat sink exclusively designed for heat dissipation. The miniaturization of an inkjet head can be realized. In addition, since the heat dissipation region is formed on the first rigid printed circuit board, when heat generated by the driver IC is dissipated through the heat dissipation region, it is unlikely for the heat to give adverse effects to the electronic circuit device fixed on the second rigid printed circuit board. The heat dissipation capability of the inkjet head is high, and the discharge property of the ink is unlikely to vary. A high-quality, compact size inkjet printer can be realized.

DETAILED DESCRIPTION OF THE INVENTION

The preferred embodiments of the invention will be described with reference to the figures.

Figure 16:
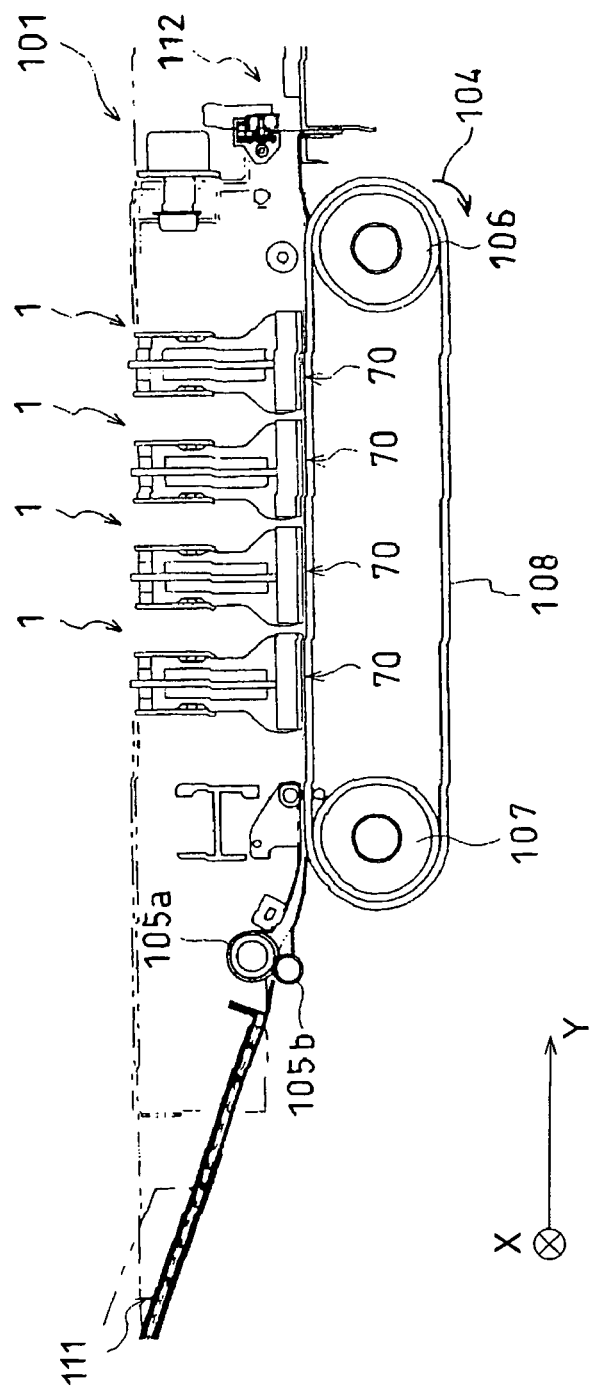
FIG. 16 shows a diagrammatic illustration of an inkjet printer that provides the inkjet head including the combined circuit unit of the first embodiment of the present invention.

FIG. 16 shows a diagrammatic illustration of an inkjet printer that includes an inkjet head and a combined circuit unit of a first embodiment of the present invention. As shown in FIG. 16, inkjet printer 101 of the first embodiment is an inkjet color printer including four inkjet heads 1. This inkjet printer 101 provides paper feeding section 111 on the left side of the figure and provides paper ejecting section 112 on the right side of the figure.

In the interior of inkjet printer 101, a sheet delivery path that delivers a sheet directed from paper feeding section 111 to paper ejecting section 112 is formed. Directly downstream of paper feeding section 111, a pair of paper feed rollers 105a and 105b is disposed to pinch and deliver the sheet which is the recording medium. The sheet is sent from the left side of the figure to the right side of the figure by the pair of paper feed rollers 105a and 105b. Disposed in the mid-section of the sheet delivery path are two belt rollers 106 and 107 as well as an endless delivery belt 108 rolled around both rollers 106 and 107 as to bridge across them. On the outer surface of delivery belt 108, in other words the delivery surface, a surface tack is applied by performing a silicon process. Belt roller 106 is rotary driven clockwise (in the direction of arrow 104), and the upper side of delivery belt 108 is sent from the left side towards the right side of the figure. It is designed so that the sheet delivered by the pair of paper feed rollers 105a and 105b can be delivered in the downstream (right side) direction.

Above delivery belt 108, four inkjet heads 1 are disposed. Four inkjet heads 1 are arranged along the sheet delivery direction (Y-axis direction). Each of inkjet heads 1 extends towards a perpendicular direction (X-axis direction) of the paper face of FIG. 16. The length of each inkjet head 1 along the X-axis direction perpendicular to the paper face in FIG. 16 is equal to the width of the sheet. A single inkjet head 1 can discharge ink in any location within the width of the sheet.

Fixed on the bottom section of each inkjet head 1 is head base 70. Each bottom surface of the four head bases 70 faces the sheet delivery path, and a multitude of nozzles 8 (refer to FIG. 8 and FIG. 9) with very small diameters are set up in these bottom surfaces. Magenta, yellow, cyan, and black inks are discharged from each of the four head bases 70.

Head base 70 is disposed so as to form a narrow gap between its bottom surface and the delivery surface of delivery belt 108, and a sheet delivery path is formed in that gap section. When a sheet, delivered in order by delivery belt 108, passes directly beneath four head bases 70, each color of ink is discharged through nozzles 8 of head base 70 towards the top surface, in other words the printing surface, of that sheet. As a result, the desired color image can be printed on the sheet.

Figure 1:
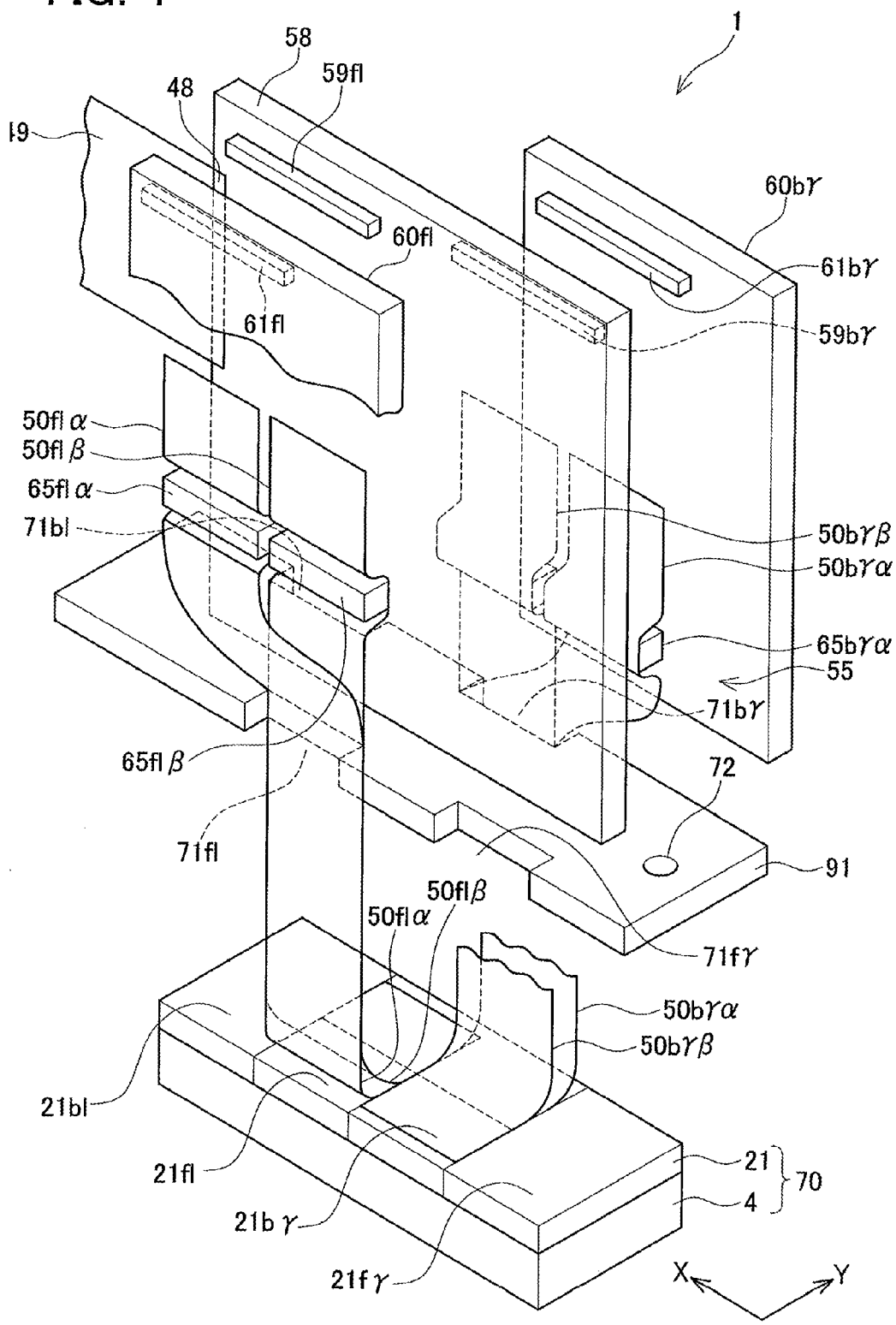
FIG. 1 shows a diagrammatic illustration of an inkjet head including a combined circuit unit of a first embodiment of the present invention.
Figure 2:
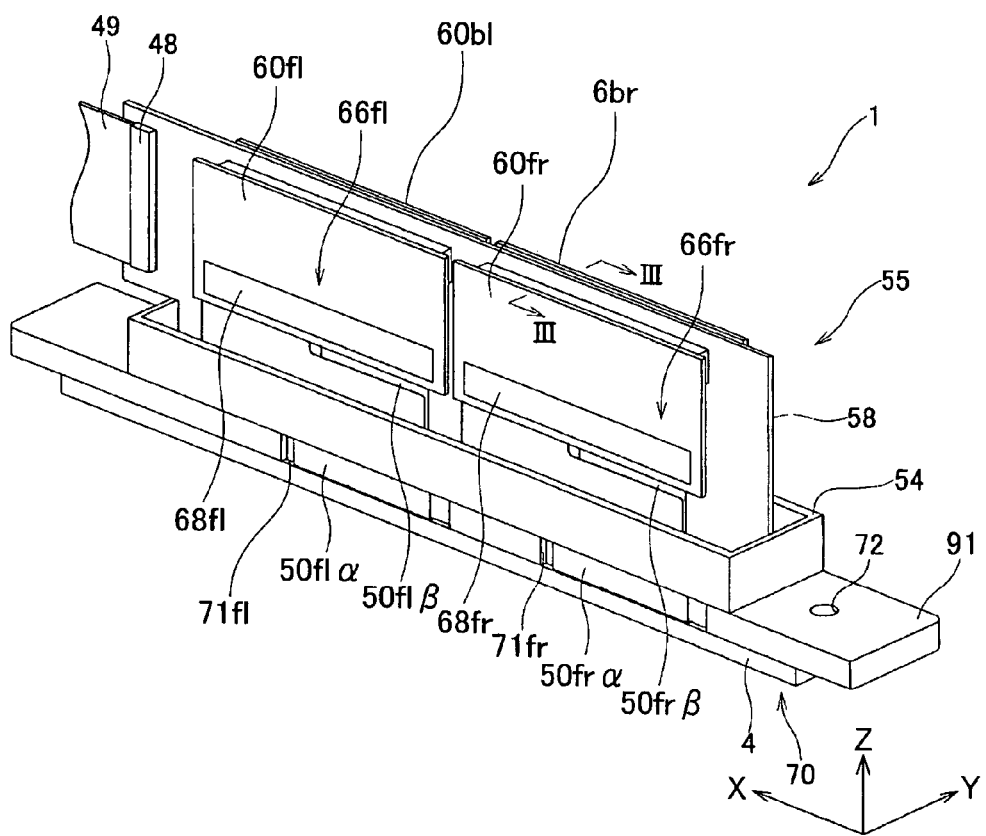
FIG. 2 shows an external perspective diagram of the inkjet head shown in FIG. 1.
Figure 3:
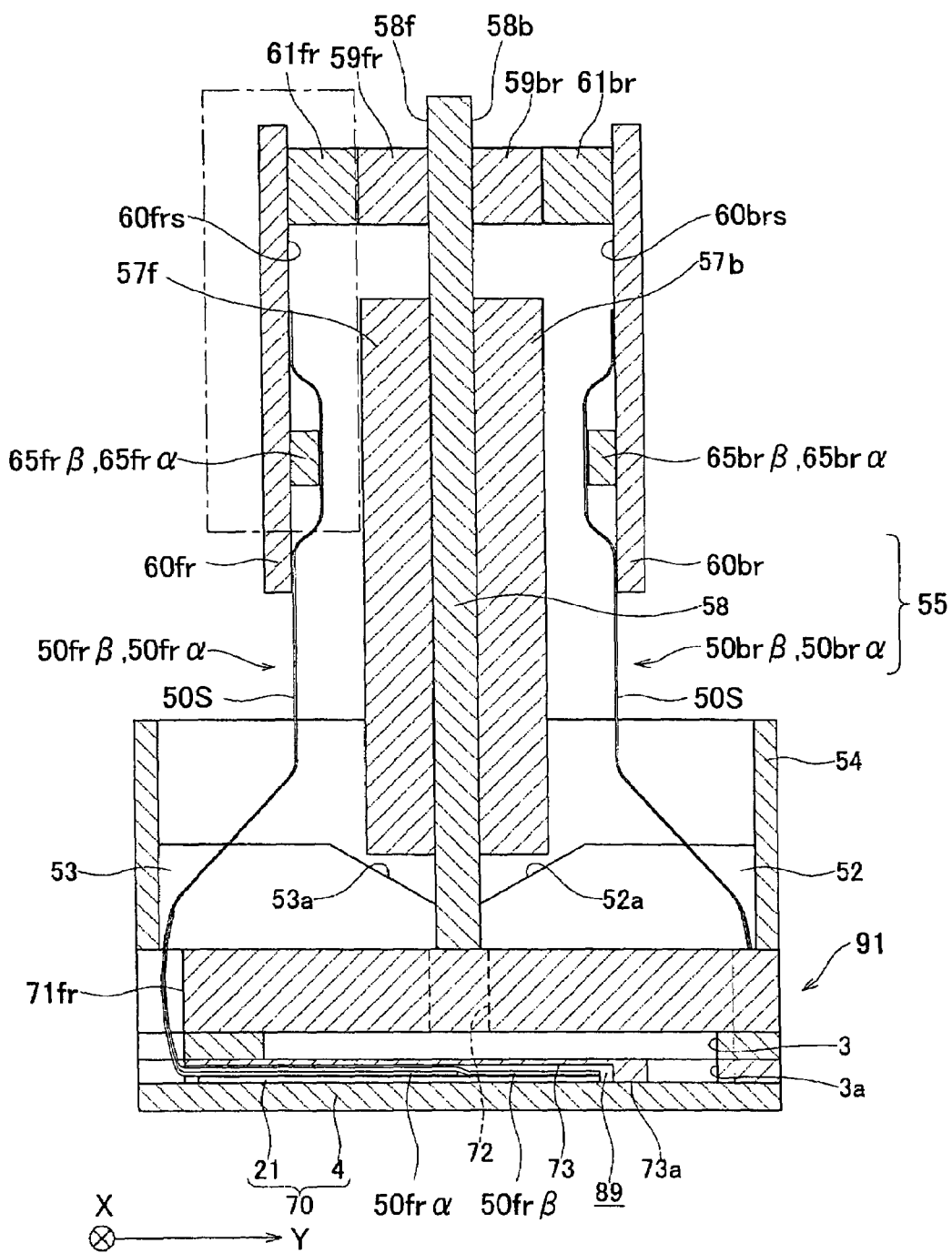
FIG. 3 shows a cross-sectional diagram along the line III-III of FIG. 2.
Figure 4:
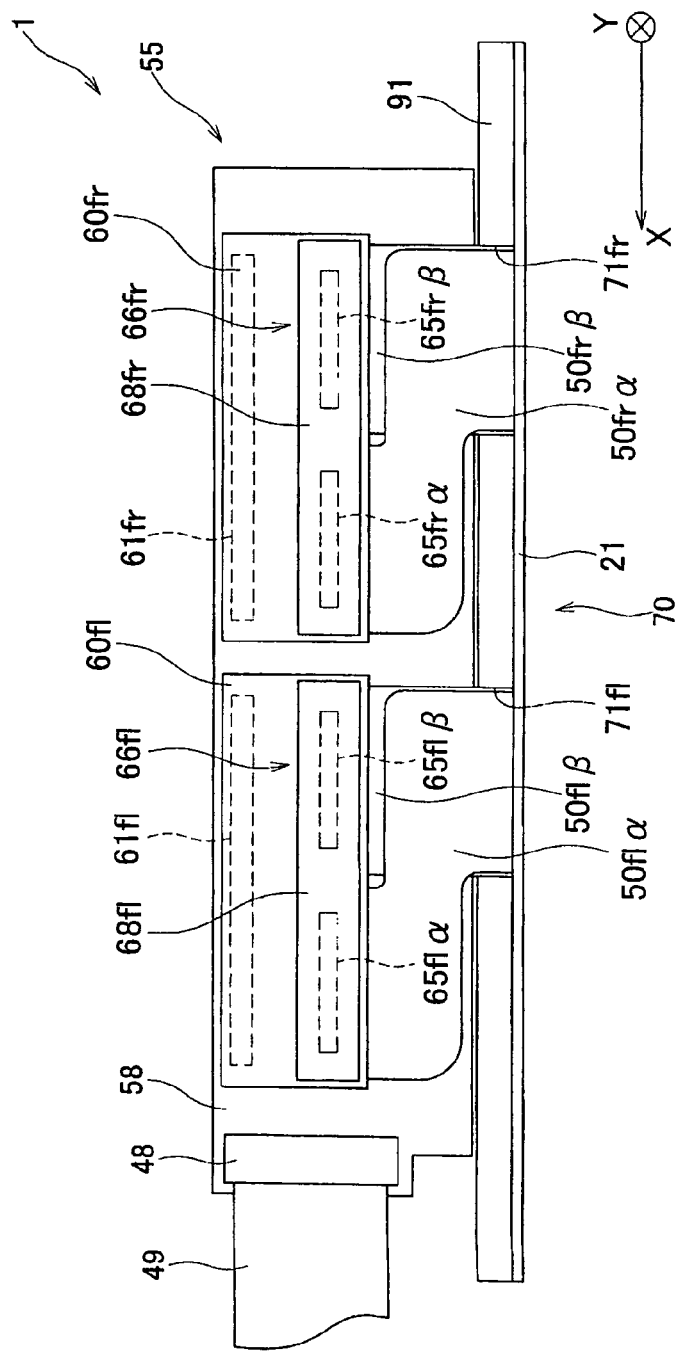
FIG. 4 shows a side diagram of the inkjet head shown in FIG. 2.
Figure 5:
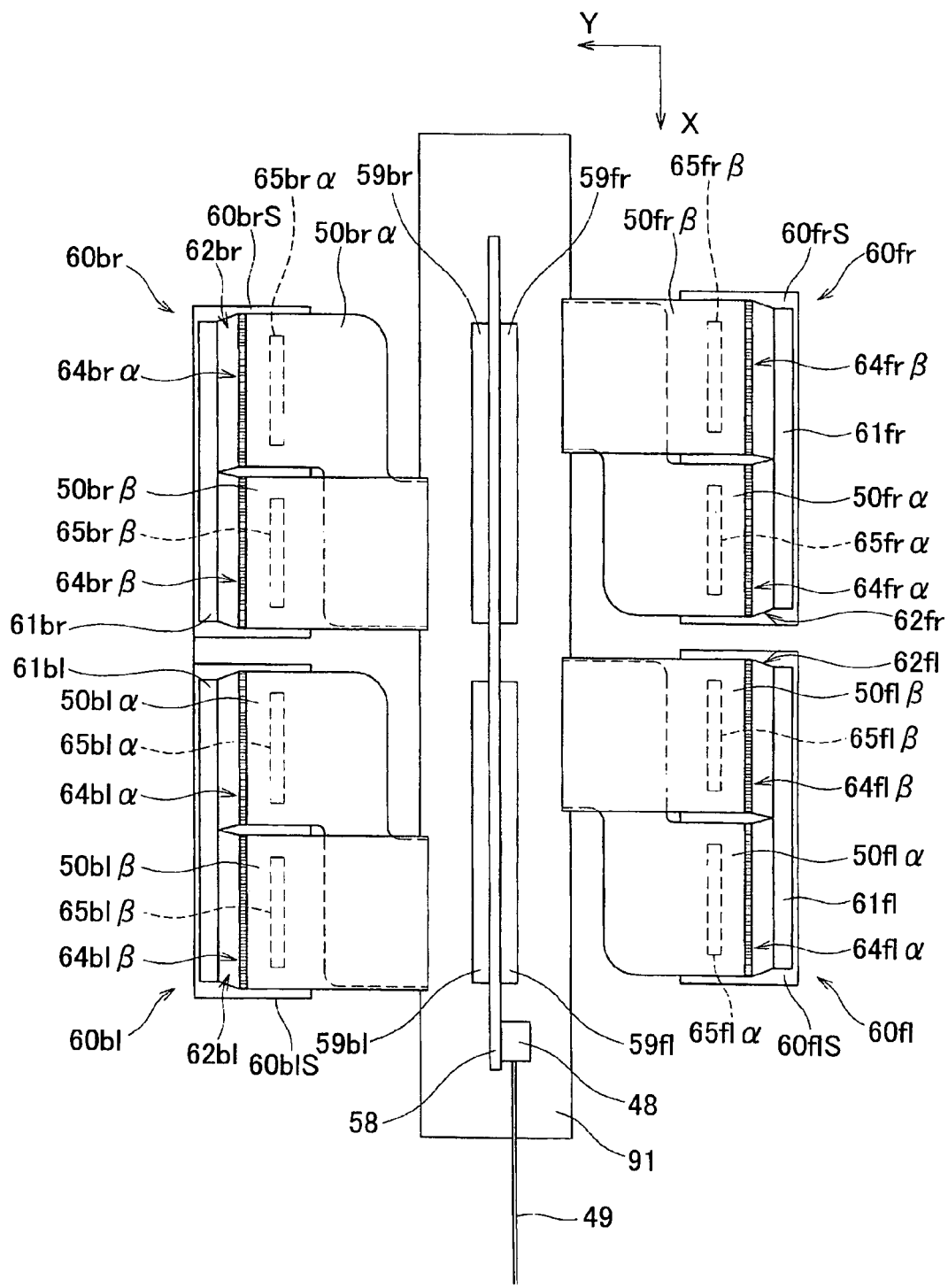
FIG. 5 shows a planar diagram of the inkjet head shown in FIG. 2 in a de-assembled condition.
Figure 6:
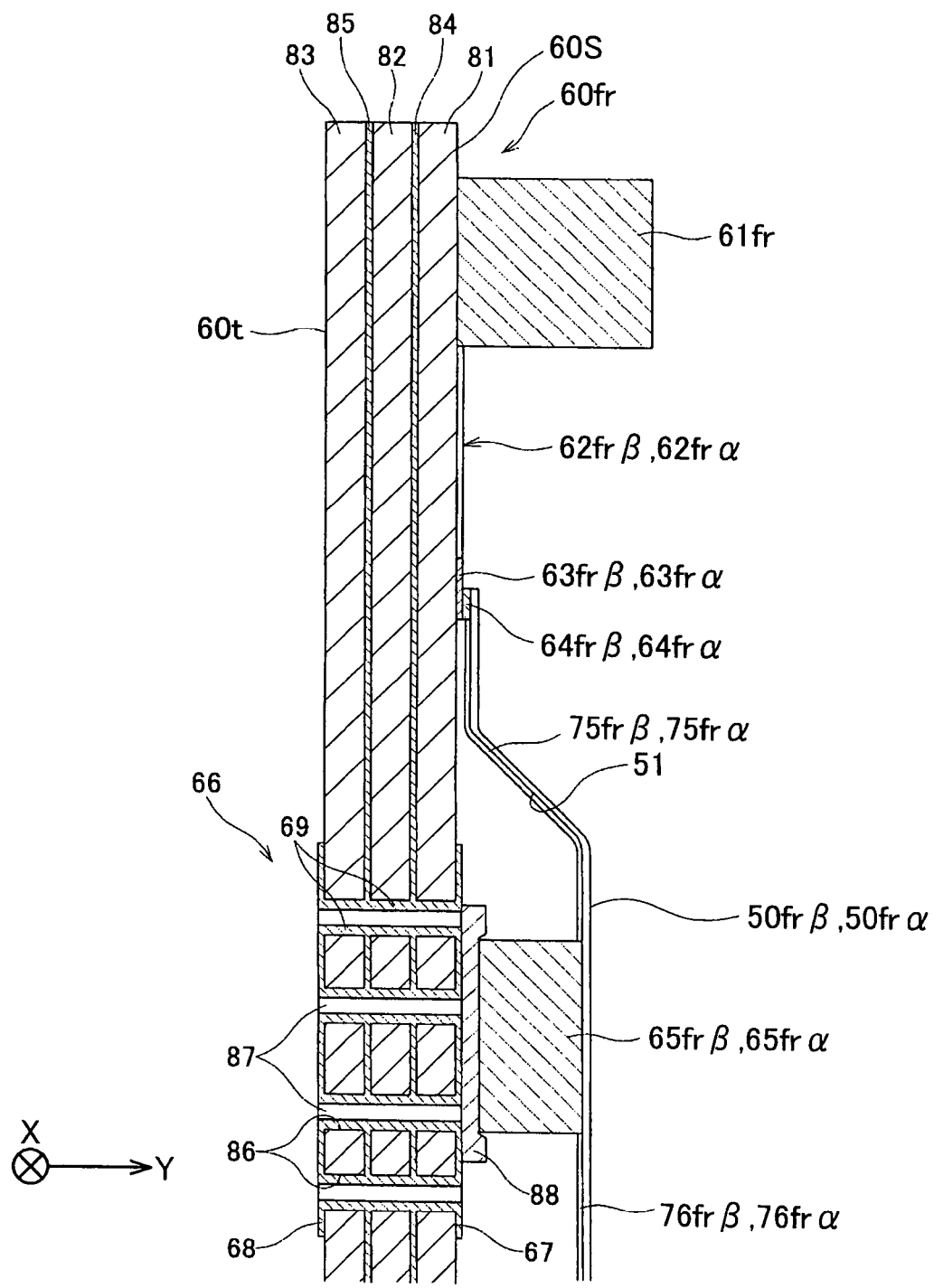
FIG. 6 shows an enlarged cross-sectional diagram of the area framed by the dashed lines shown in FIG. 3.

FIG. 1 and FIG. 2 are external perspective diagrams of inkjet head 1 shown in FIG. 16. FIG. 3 is a cross-sectional diagram along the line 111-111 of FIG. 2. FIG. 4 is a side diagram of inkjet head 1 shown in FIG. 2. FIG. 5 is a planar diagram of inkjet head 1 in a de-assembled condition (a state where connector 61 of sub printed circuit board 60 is pulled out from connector 59 of main printed circuit board described hereinafter). FIG. 6 is an enlarged cross-sectional diagram of the area framed by the dashed lines shown in FIG. 3. In FIG. 4 and FIG. 5, the diagrammatic representation of cover 54 has been omitted to make the diagrams easier to understand. In addition, in FIG. 1, only a part of the members is shown to make the diagram easier to understand.

As shown in FIGS. 1-3, inkjet head 1 has head base 70 which is long in the main scanning direction (the X-axis direction in the figure which is perpendicular to the paper surface of FIG. 16), base block 91 which is disposed on the top surface of head base 70 and stores ink to supply to head base 70, combined circuit unit 55 which is disposed above base block 91, and cover 54 (the diagrammatic representation of cover 54 has been omitted in FIG. 1) which supports one section of combined circuit unit 55 mounted on the top surface of base block 91.

Head base 70 includes flow channel unit 4, which has an ink flow channel formed in the interior, and four actuator units (piezoelectric actuator units) 21bl, 21fl, 21br, and 21fr attached to the top surface of flow channel unit 4.

Flow channel unit 4 is constructed by stacking and attaching a plurality of thin layers. A plurality of depressions is formed on the top surface, a plurality of nozzles is formed on the bottom surface, and a plurality of ink flow channels joining each depression to each nozzle is formed in the interior. The four actuator units 21bl, 21fl, 21br, and 21fr cover the top surface of flow channel unit 4, and are attached to the top surface of flow channel unit 4. The four actuator units 21bl, 21fl, 21br, and 21fr cover the plurality of depressions formed on the top surface of flow channel unit 4, and form a plurality of pressure chambers.

Base block 91 is disposed on the upper surface of head base 70. Base block 91 is made from such metallic material as stainless steel. Internally of base block 91, a hollow region of an approximately rectangular parallelepiped shaped along the longitudinal direction of base block 91 is formed and provides ink storage 3.

As shown in FIG. 3, bottom surface 73 of base block 91 protrudes further downward than the surrounding area in the vicinity of opening 3*a*. Also, base block 91 is contacting flow channel unit 4 only in the vicinity section 73*a* of opening 3*a* of bottom surface 73. Accordingly, the region outside the vicinity section 73*a* of opening 3*a* of bottom surface 73 of base block 91 is separated from head base 70, and open space 89 is formed in this separated section. Actuator unit 21 is disposed within this open space 89.

Ink installation hole 72, connected to an ink supply-pipe not shown in the figure, is formed in the vicinity of one end portion of base block 91. The ink supply-pipe is connected to an ink tank which is not shown in the figure. Base block 91 pours ink supplied from ink installation hole 72 into ink storage 3, stores the ink, and supplies the ink to manifold (common ink chamber) 5 described hereinafter and formed in flow channel unit 4.

In addition, as shown in FIG. 1, four notches 71*fl*, 71*fr*, 71*bl*, and 71*br* are formed on both end portions of the sheet delivery direction (Y-axis direction in the Figure) of base block 91. Each of notches 71 penetrates in the height direction of base block 91, and its planar shape is rectangular. Each of notches 71 opens towards the sheet delivery direction. The four notches 71*fl*, 71*fr*, 71*bl*, and 71*br* are formed in a zigzag alignment. Each of notches 71, as shown in FIG. 3, communicates with the open space 89. The planar shape of base block 91, with the exception of the four notches 71, is in effect equal in shape and dimension to the planar shape of flow channel unit 4.

As shown in FIG. 1 and FIG. 3, two flexible printed circuit films (abbreviated as FPC hereon) 50 are electrically connected on the top surface of each actuator unit 21. In other words, FPC 50*fl*α and 50*fl*β are connected to the top surface of actuator unit 21*fl*, FPC 50*br*α and 50*br*β are connected to the top surface of actuator unit 21*br*, FPC 50*bl*α and 50*bl*β are connected to the top surface of actuator unit 21*bl* (the diagrammatic representation of FPC 50*bl*α and 50*bl*β has been omitted in FIG. 1, but it is shown in FIG. 5), and FPC 50*fr*α and 50*fr*β are connected on the top surface of actuator 21*fr* (the diagrammatic representation of FPC 50*fr*α and 50*fr*β has been omitted in FIG. 1, but it is shown in FIG. 5).

In this specification, subscript f stands for members belonging to the front side of FIG. 1 of main printed circuit board 58 described hereinafter, subscript b stands for members on the back side of FIG. 1 of the main printed circuit board 58, subscript 1 stands for members corresponding to the left side half of FIG. 1 of flow channel unit 4, subscript r stands for members corresponding to the right side half of FIG. 1 of flow channel unit 4, α stands for members at the left side or outer side when facing main printed circuit board 58, and β stands for members at the right side or inner side when facing main printed circuit board 58. Hereon, subscripts will be omitted when explaining events that are common to a plurality of members. For example, when referring to FPC 50α, it collectively refers to FPC 50*fl*α, FPC 50*fr*α, FPC 50*bl*α, and FPC 50*br*α, and it describes events common to them. For example, when referring to FPC 50*l*, it collectively refers to FPC 50*fl*α, FPC 50*fl*β, FPC 50*bl*α, and FPC 50*bl*β, and it describes events common to them.

One of notches 71 corresponds to one of actuator units 21, and two FPCs 50 pass through one notch 71. In other words, FPC 50*fl*α and FPC 50*fl*β for actuator unit 21*fl* pass through notch 71*fl*, FPC 50*br*α and FPC 50*br*β for actuator unit 21*br* pass through notch 71*br*, FPC 50*fr*α and FPC 50*fr*β for actuator unit 21 *fr* pass through notch 71 *fr* (in FIG. 1, the diagrammatic representation of FPC 50*fr*α and FPC 50*fr*β has been omitted), and FPC 50*bl*α and FPC 50*bl*β for actuator unit 21*bl* pass through notch 71*bl* (in FIG. 1, the diagrammatic representation of FPC 50*bl*α and FPC 50*bl*β has been omitted).

Combined circuit unit 55 is prepared to control the current flow to be supplied to the four actuator units 21*bl*, 21*fl*, 21*br*, and 21*fr*.

As shown in FIGS. 1-4, combined circuit unit 55 includes one main printed circuit board (a second rigid printed circuit board) 58, four sub printed circuit boards (first rigid printed circuit boards) 60*fl*, 60*fr*, 60*bl*, and 60*br*, and eight FPCs 50*fl*α, 50*fl*β, 50*fr*α, 50*fr*β, 50*bl*α, 50*bl*β, 50*br*α, and 50*br*β.

Figure 17:
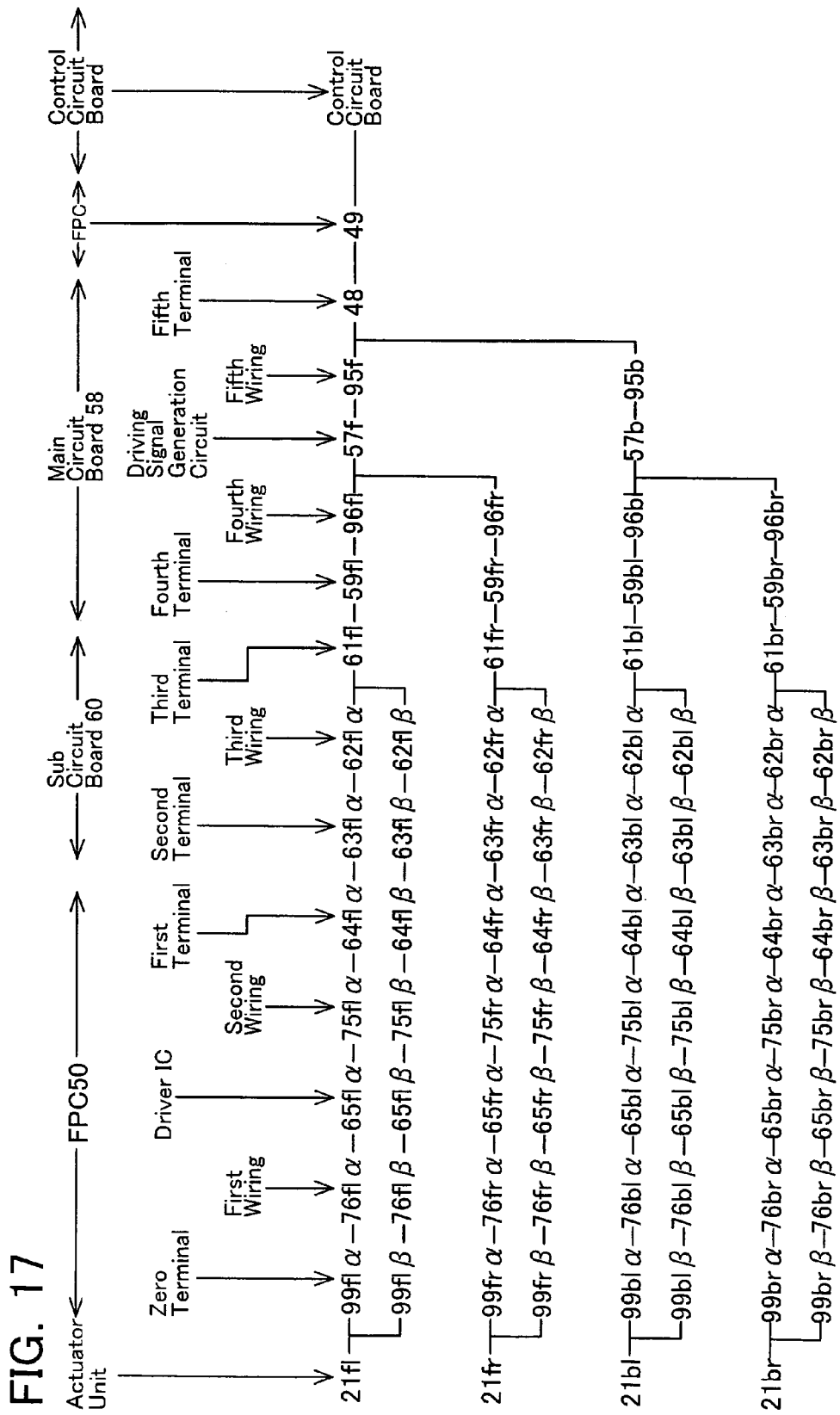
FIG. 17 shows the relationship of the electrical connectivity of the inkjet head including the combined circuit unit of the first embodiment of the present invention.

FIG. 17 shows the relationship of electrical connectivity secured by combined circuit unit 55. In the following, the subscripts will be omitted in explaining the connectivity. As shown in the right side of FIG. 17, FPC 49 (also shown in FIGS. 1 and 2) is connected to a control printed circuit board not shown in FIG. 1, and that FPC 49 is connected to fifth terminals 48 of main printed circuit board 58. The numbers of the terminals are shown from the left side of FIG. 17.

Fifth wirings 95 that connect fifth terminals 48 and driving signal generation circuit 57 described hereinafter are formed on main printed circuit board 58. Driving signal generation circuit 57 is connected to fourth wirings 96, and fourth terminals 59 are formed on the end portions of fourth wirings 96. Fourth terminals 59 are formed on a female connector.

Third terminals 61 to be connected to fourth terminals 59 are formed on sub printed circuit board 60. Third terminals 61 are formed on a male connector. By connecting male connector 61 of sub printed circuit board 60 to female connector 59 of main printed circuit board 58, fourth terminals 59 and third terminals 61 are connected, and the relative position between main printed circuit board 60 and sub printed circuit board 61 becomes mechanically restrained. Formed on sub printed circuit board 60 are second terminals 63 and third wirings 62 that connect second terminals 63 and third terminals 61. Heat dissipation section 68, described hereinafter, is also formed on sub printed circuit board 60.

First terminals 64 to be connected to second terminals 63 are formed on FPC 50. First terminals 64 are formed on the end portions of second wirings 75 formed on FPC 50, and driver IC 65 is connected to the other end portions of second wirings 75. The driver IC is connected to first wirings 76 formed on FPC 50, and terminals 99 are formed on the end portions of first wirings 76. Terminals 99 are connected to individual electrodes formed on the top surface of actuator unit 21. Terminals 99 are connected to first terminals 64 through first wirings 76, driver IC 65, and second wirings 75. First terminals 64 are formed on the end portions of second wirings 75, wherein second wirings 75 are connected to the driver IC 65, and further connected to actuator unit 21 through first wirings 76 and terminals 99.

Main printed circuit board 58 is single, but two driving signal generation circuit device 57 is prepared and is disposed in the front and the back sides of main printed circuit board 58. The front side will be represented with subscript f, and the back side will be represented with subscript b.

Two sets of fourth terminals 59 have been prepared on the front side of main printed circuit board 58, and two sets of fourth terminals 59 have been prepared on the back side of main printed circuit board 58. A total of four sets of fourth terminals 59 is prepared, and to match to that, a total of four sub printed circuit boards 60 is prepared. With respect to FIG. 5, the bottom right ones will be represented with subscripts fl, the top right ones will be represented with subscripts fr, the bottom left ones will be represented with subscripts bl, and the top left ones will be represented with subscripts br.

As shown in FIG. 17, two sets of second terminals 63 are prepared on a single sub printed circuit board 60, and each set of second terminals 63 is connected to a single FPC 50. A total of eight sets of second terminals 63 are prepared, and a total of eight FPCs 50 are prepared. With respect to FIG. 1, the ones on the left side when facing main printed circuit board 58 are represented with subscript α, and the ones on the right side are represented with subscript β. As described above, two FPCs 50 are connected to a single actuator unit 21. Eight FPCs 50 are prepared because four actuator units 21 exist.

In this specification, members with eight corresponding or identical parts are distinguished with subscripts flα, flβ, frα, frβ, blα, blβ, brα, and brβ. For members with only four, they are distinguished with subscripts fl, fr, bl, br. For members with only two, they are distinguished with subscripts f and b. Subscripts will be omitted when explaining events that are common to a plurality of members. For example, when referring to FPC 50α, it collectively refers to FPC 50flα, FPC 50frα, FPC 50blα, FPC 50brα, and when referring to FPC 50l, it collectively refers to FPC 50flα, FPC 50flβ, FPC 50blα, FPC 50blβ.

As shown in FIG. 2, main printed circuit board 58 has a rectangular shape long in the X direction, short in the Z direction and thin in the Y direction. Main printed circuit board 58 is constructed with a relatively rigid insulating material, and its front surface 58f and back surface 58b are supported by cover 54 so as to be perpendicular to the top surface of base block 91. Front surface 58f faces sub printed circuit boards 60fl and 60fr, and back surface 58b faces sub printed circuit boards 60bl and 60br.

As shown in FIG. 2, cover 54 has a rectangular, cylindrical shape. As shown in FIG. 3, claws 52 and 53 which protrude inward from and within both sides of the wall of cover 54 are formed. Claws 52 and 53 are formed at two locations in the X-direction shown in the figure. In other words, claws 52 and 53 are formed in four locations of the inner wall of cover 54. Notch sections 52a and 53a, cut and tapered so the height gradually decreases as they approach from the inner walls of cover 54 towards main printed circuit board 58, are formed on claws 52 and 53. In addition, the ends of claws 52 and 53 are separated from each other, and the distance of separation is approximately equal to the thickness of main printed circuit board 58. By disposing the bottom end portion of main printed circuit board 58 between the front ends of claws 52 and 53, the bottom end portion of main printed circuit board 58 becomes wedged between claws 52 and 53. Main printed circuit board 58 becomes supported by cover 54, and front surface 58f and back surface 58b of main printed circuit board 58 become perpendicular to the top surface of base block 91. In addition, since notch sections 52a and 53a are formed on the front ends of claws 52 and 53, it is easier to dispose the bottom end portion of main printed circuit board 58 between the front ends of claws 52 and 53.

As shown in FIG. 2 and FIG. 4, fifth terminals 48, extending in the height direction on front surface 58f, are formed on one end portion in the X-direction of main printed circuit board 58. FPC 49 is connected to fifth terminals 48. The other end of FPC 49 not shown in the figure is connected to control printed circuit board shown in FIG. 17.

As shown in FIG. 3, driving signal generation circuit device (a second front electronic circuit device) 57f are fixed in approximately the middle region of front surface 58f of main printed circuit board 58. Driving signal generation circuit device (a second back electronic circuit device) 57b are fixed in approximately the middle region of back surface 58b of main printed circuit board 58.

Front side female connectors 59fl and 59fr (fourth front terminals) are fixed on an upper end portion of front surface 58f of main printed circuit board 58. Back side female connectors 59bl and 59br (fourth back terminals) are fixed on the upper end portion of back surface 58b of main printed circuit board 58.

Wirings 95f (fifth front wirings), which connect fifth terminals 48 and driving signal generation circuit device (a second front electronic circuit device) 57f, is formed on front surface 58f of main printed circuit board 58. Wirings 95b (fifth back wirings), which connect fifth terminals 48 and driving signal generation circuit device (a second back electronic circuit device) 57b, is formed on back surface 58b of main printed circuit board 58.

Wirings (fourth front wirings) 96fl and 96fr, which connect driving signal generation circuit device (second front electronic circuit device) 57f to female connectors 59fl and 59fr, are formed on front surface 58f of main printed circuit board 58. Wirings (fourth back wirings) 96bl and 96br, which connect driving signal generation circuit device (second back electronic circuit device) 57b to female connectors 59bl and 59br, are formed on back surface 58b of main printed circuit board 58. Female connectors 59fl and 59fr provide fourth front terminals, and female connectors 59bl and 59br provide fourth back terminals.

As shown in FIG. 6, sub printed circuit board 60 has a laminated structure in which three sheets, 81, 82, and 83 of relatively rigid insulating material are laminated. Copper-foiled thin films 84 and 85 (third heat conducting thin film) are formed between each of sheets 81-83. Each of thin films 84 and 85 extends and spans the entire surface of each of sheets 81-83 with respect to the sheet that it faces. Each of thin films 84 and 85 is connected to ground in a region not shown in the figure, and is maintained at ground potential.

Male connector 61 is fixed on each sub printed circuit board 60. Four female connectors 59fl, 59fr, 59bl, and 59br are fixed on main printed circuit board 58. Male connector 61fl of sub printed circuit board 60fl is connected to female connector 59fl, male connector 61 fr of sub printed circuit board 60fr is connected to female connector 59fr, male connector 61bl of sub printed circuit board 60bl is connected to female connector 59bl, and male connector 61br of sub printed circuit board 60br is connected to female connector 59br. When male connector 61 is connected to female connector 59, main printed circuit board 58 and sub printed circuit board 60 are fixed into position so as to extend nearly parallel to each other. Male connector 61 of each sub printed circuit board 60 provides third terminals.

Second terminals 63α, to be connected to first terminals 64α formed on the upper end of FPC 50α, are formed at approximately the midway height of sub printed circuit board 60. Second terminals 63β, to be connected to first terminals 64β formed on the upper end of FPC 50β, are formed at the location where it is adjacent to second terminals 63α.

In other words, second terminals 63flα and 63flβ are formed on sub printed circuit board 60fl. Second terminals 63frα and 63frβ are formed on sub printed circuit board 60fr. Second terminals 63blα and 63blβ are formed on sub printed circuit board 60*bl*. Second terminals 63*br*α and 63*br*β are formed on sub printed circuit board 60*br*.

FPC fl α, which includes first terminals 64*fl*α, is connected to second terminals 63*fl*α. FPC flβ, which includes first terminals 64*fl*β, is connected to second terminals 63*fl*β. FPC fr α, which includes first terminals 64*fr*α, is connected to second terminals 63*fr*α. FPC frβ, which includes first terminals 64*fr*β, is connected to second terminals 63*fr*β. FPC bl α which includes first terminals 64*bl*α is connected to second terminals 63*bl*α. FPC blβ, which includes first terminals 64*bl*β, is connected to second terminals 63*bl*β. FPC br α, which includes first terminals 64*br*α, is connected to second terminals 63*br*α. FPC brβ, which includes first terminals 64*br*β, is connected to second terminals 63*br*β.

As shown in FIG. 5 and FIG. 6, third wirings 62 which connect third terminals (male connector) 61 and second terminals 63 are formed on sub printed circuit board 60.

In other words, third wirings 62*fl*α, which connect third terminals 61*fl*α and second terminals 63*fl*α, and third wirings 62*fl*β, which connect third terminals 61*fl*β and second terminals 63*fl*β, are formed on sub printed circuit board 60*fl*. Third wirings 62*fr*α, which connect third terminals 61*fr*α and second terminals 63*fr*α, and third wirings 62*fr*β, which connect third terminals 61*fr*β and second terminals 63*fr*β, are formed on sub printed circuit board 60*fr*. Third wirings 62*bl*α, which connect third terminals 61*bl*α and second terminals 63*bl*α, and third wirings 62*bl*β, which connect third terminals 61*bl*β and second terminals 63*bl*β, are formed on sub printed circuit board 60*bl*. Third wirings 62*br*α, which connect third terminals 61*br*α and second terminals 63*br*α, and third wirings 62*br*β, which connect third terminals 61 br α and second terminals 63*br*β, are formed on sub printed circuit board 60*br*. Third wirings 62 are copper-foiled.

As shown in FIG. 4, heat dissipation region 66 is formed at a location on the bottom section of sub printed circuit board 60. Heat dissipation region 66 faces FPCs 50α and 50β. As shown in FIG. 6, heat dissipation region 66 includes thin film (first heat conducting film) 67 formed on surface 60*s* of sub printed circuit board 60 facing main printed circuit board 58. Heat dissipation region 66 also includes thin film (second heat conducting film) 68 formed on the opposite surface 60*t* of sub printed circuit board 60 and thermal via (heat conducting member) 69 formed on inner walls of a plurality of holes 86 penetrating in the thick direction of sub printed circuit board 60. In the present embodiment, thin films 67 and 68, thermal via 69, and third wirings 62 are constructed with the same copper-foil. Due to thin films 67 and 68, thermal via 69, and third wirings 62 being constructed with the same copper-foil, it becomes possible to manufacture thin films 67 and 68, thermal via 69, and third wirings 62 with the same process of manufacturing. It becomes unnecessary to manufacture third wirings 62 and thin films 67 and 68 with different processes, and manufacturing costs and manufacturing man-hours can be reduced.

Thermal via 69 joins both thin films 67 and 68 and thin films 84 and 85 as to integrate them into one. Since thermal via 69 is attached to the inner walls of holes 86, cavities 87 which penetrate towards the thick direction of sub printed circuit board 60 are formed on the inside of holes 86. In addition, gold coating is applied to the surface of thin films 67 and 68 and thermal via 69. Accordingly, it becomes easier for the heat that transferred to thin film 67 to transfer to thin film 68 through thermal via 69. Cavities 87 (in other words, within thermal via 69) may be filled with a heat conducting member (such as metal). Accordingly, it becomes even easier for the heat that is transferred to thin film 67 to transfer to thin film 68 through the heat conducting member 69. The heat conducting member may be filled when the opening area of cavity 87 is relatively small, and may not be filled when the opening area is relatively large.

The four sub printed circuit boards 60 provide a common shape and wiring pattern, and they can be utilized without being distinguished. In other words, there is no difference among sub printed circuit boards 60*fl*, 60*fr*, 60*bl*, and 60*br*.

Driver IC 65 is mounted on a surface of each FPC 50. In other words, driver IC 65*fl*α is mounted on the surface of FPC 50*fl*α, driver IC 65*fl*β is mounted on the surface of FPC 50*fl*β, driver IC 65*fr*α is mounted on the surface of FPC 50*fr*α, and driver IC 65*fr*β is mounted on the surface of FPC 50*fr*β. Driver ICs 65*fl*α, 65*fl*β, 65*fr*α, and 65*fr*β correspond to a first front electronic circuit device. Similarly, driver IC 65*bl*α is mounted on the surface of FPC 50*bl*α, driver IC 65*bl*β is mounted on the surface of FPC 50*bl*β, driver IC 65*br*α is mounted on the surface of FPC 50*br*α, and driver IC 65*br*β is mounted on the surface of FPC 50*br*β. Driver ICs 65*bl*α, 65*bl*β, 65*br*α, and 65*br*β correspond to a first back electronic circuit device.

Terminals 99α and 99β to be connected to individual electrodes of actuator unit 21 are formed on the bottom end of FPCs 50α and 50β. As shown in FIG. 3, FPCs 50α and 50β are connected to individual electrodes at the top surface of one actuator unit. FPC 50β is connected to a part of the surface (top surface region of actuator unit 21 on the right side of FIG. 3) of actuator unit 21 located away and to the back of notch 71, and FPC 50α is connected to the other part of the top surface (top surface region of actuator unit 21 on the left side of FIG. 3) of actuator unit 21 located near notch 71. Since four actuator units 21 are set up above flow channel unit 4, a total of eight FPCs 50 are connected to head base 70. In addition, as shown in FIG. 5, FPCs 50α and 50β have different lengths, and while FPC 50β is pulled out virtually straight from and above notch 71, FPC 50α curves above notch 71 and is pulled out to reach second terminals 63α of sub printed circuit board 60.

As shown in FIG. 6, with respect to one end of surface 51 which faces flat surface 60*s* of sub printed circuit board 60, terminals (first terminals) 64α and 64β are formed on FPCs 50α and 50β. First terminals 64α and 64β of FPCs 50α and 50β are connected by soldering to second terminals 63α and 63β of sub printed circuit board 60.

Driver ICs 65α and 65β are each disposed on surface 51 of FPCs 50α and 50β facing sub printed circuit board 60. Driver ICs 65α and 65β are disposed in locations facing heat dissipation region 66 of sub printed circuit board 60.

Formed above surface 51 are second wirings 75β and 75β, which respectively connect driver ICs 65α and 65β to first terminals 64α and 64β, and first wirings 76α and 76β, which respectively connect driver ICs 65α and 65β to terminals 99α and 99β on the actuator unit 21 side.

Driver ICs 65α and 65β of FPCs 50α and 50β are attached and thermally coupled to heat conducting thin film 67 by adhesion layer 88 composed of a two-sided tape. Adhesion layer 88 is disposed as to cover a part of an opening on the flat surface 60*s* side of a plurality of cavities 87.

The four FPCs 50α provide a common shape and wiring pattern, and can be utilized without being distinguished. In other words, there is no difference among FPCs 50*fl*α, 50*fr*α, 50*bl*α, and 50*br*α. Similarly, the four FPCs 50β provide a common shape and wiring pattern, and can be utilized without being distinguished. In other words, there is no difference among FPCs 50*fl*β, 50*fr*β, 50*bl*β, and 50*br*β.

In this way, as shown in FIG. 17, one main printed circuit board 58, four sub printed circuit boards 60, eight FPCs 50, and four actuator units 21 are electrically connected.

From the above description, items described with subscripts being omitted indicate that they are common events among members classified by omitting the subscripts. For example, FPC 50α indicates any of FPCs 50*fl*α, 50*fr*α, 50*bl*α, and 50*dr*α.

Figure 7:
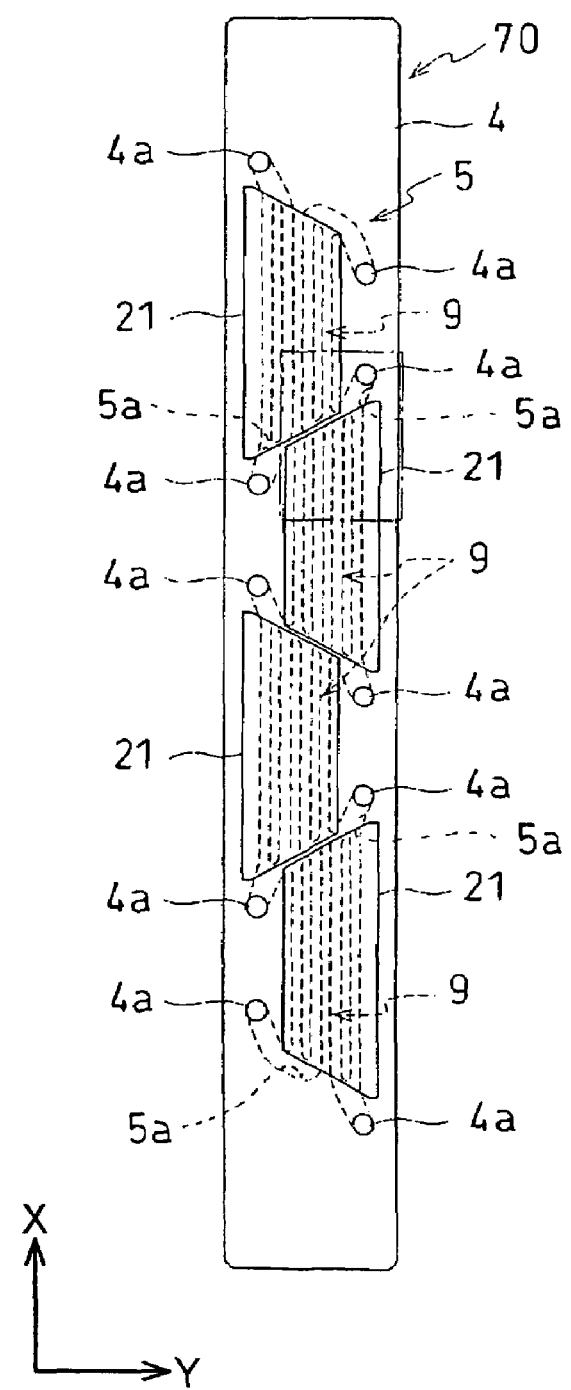
FIG. 7 shows a planar diagram of a head base shown in FIG. 2.
Figure 8:
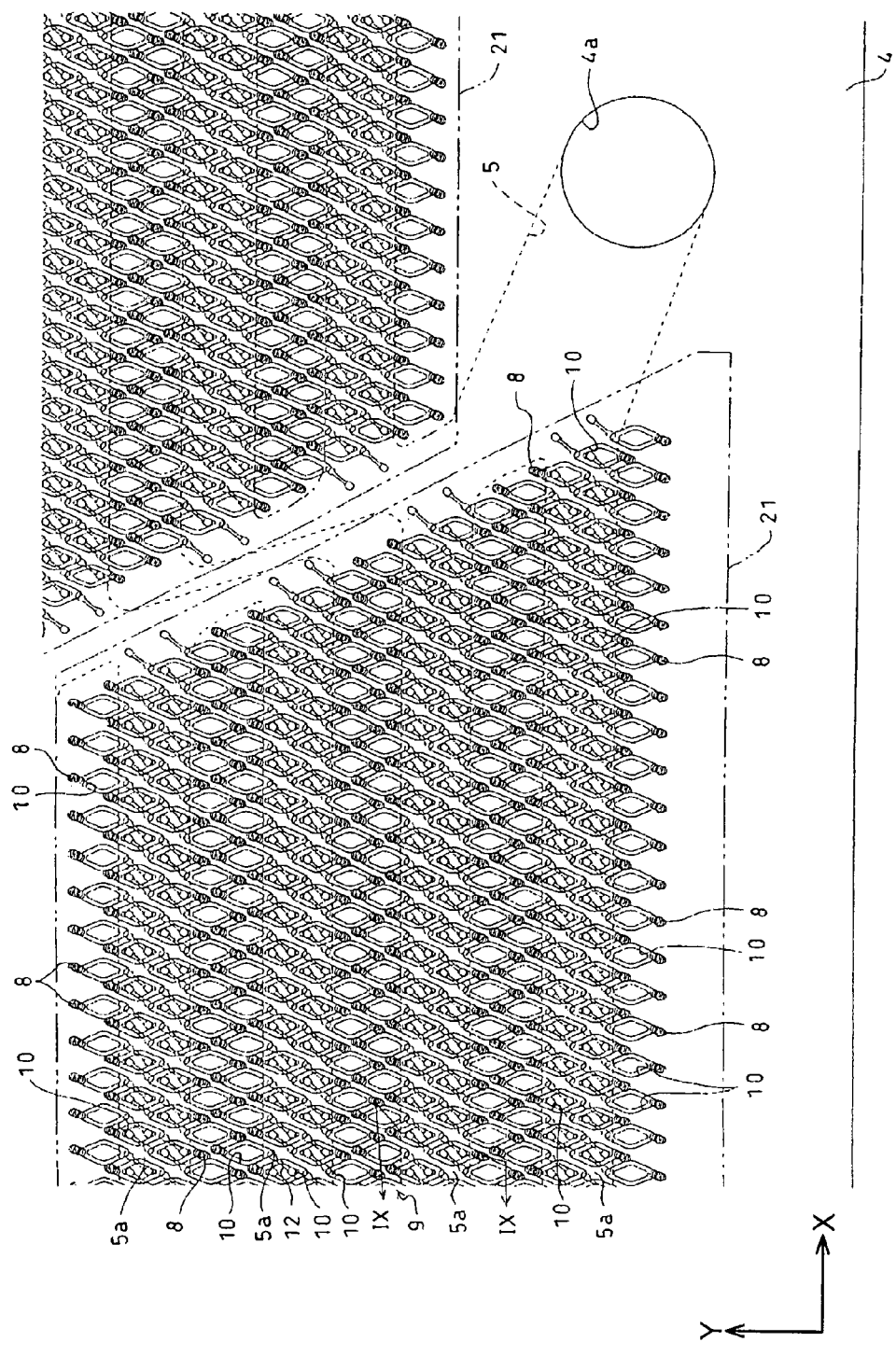
FIG. 8 shows an enlarged planar diagram of the area framed by the dashed lines shown in FIG. 7.

Next, the configuration of head base 70 will be described in detail. FIG. 7 is a planar diagram of head base 70 shown in FIG. 2. FIG. 8 is an enlarged planar diagram of the area framed by dashed lines in FIG. 7. In FIG. 8, a diagrammatic representation of actuator 21 is omitted, while nozzles 8 are represented with solid lines where essentially they should be represented with dotted lines.

As shown in FIG. 7 and FIG. 8, head base 70 includes flow channel unit 4. A plurality of depressions 10, which constructs pressure chambers 9, is formed on a top surface of flow channel unit 4, and the same number of nozzles 8 as the number of depressions 10 is formed on a bottom surface of flow channel unit 4. Inside of flow channel unit 4, the same number of flow channels as the number of depressions 10 is formed, and each flow channel is linked to each depression 10 and each nozzle 8. The plurality of depressions 10, as shown in FIG. 8, is disposed in a matrix configuration.

As shown in FIG. 7, four actuator units 21 are attached to the top surface of flow channel 4, and they cover depressions 10. Each actuator unit 21 is trapezoidal, and is disposed adjacently while alternating directions. On the top surface of each actuator unit 21, individual electrodes are formed in the same positional pattern as the positional pattern of depressions 10.

Each actuator unit 21 is disposed so that parallel sides (a left side and a right side in FIG. 7) extend along the longitudinal direction (X direction) of flow channel unit 4, and oblique sides of adjacent actuator units 21 overlap with each other. With respect to FIG. 7, individual electrodes that exist within a region from a central axis to a shorter parallel side are connected to FPC 50β, and individual electrodes that exist within a region from the central axis to a longer parallel side are connected to FPC 50α, wherein the central axis extends along the X direction. In this way, by connecting two FPCs, 50α and 50β to a single actuator unit 21, the intervals among a plurality of wiring patterns that construct wirings formed on FPC 50α and FPC 50β are widened. As a result, FPC 50α and 50β become easier to manufacture.

A bottom face of flow channel unit 4 that faces a region attached to actuator unit 21 is an ink discharging region. As shown in FIG. 8, on a bottom surface of the ink discharging region, a plurality of nozzles 8 is lined up in a matrix configuration. Each one of nozzles 8 links to each one of pressure chambers 10 to which it corresponds.

Figure 9:
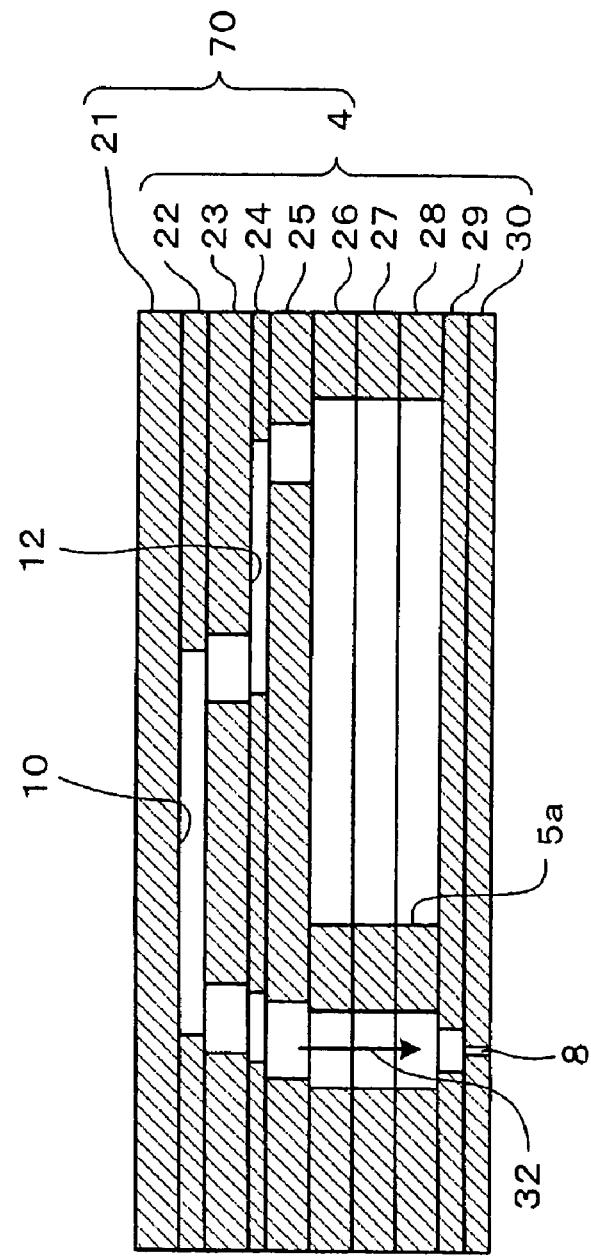
FIG. 9 shows a cross-sectional diagram along the line IX-IX of FIG. 8.

As shown in FIG. 9, head base 70 comprises of a laminated structure in which ten sheet, from top to bottom, actuator unit 21, cavity plate 22, base plate 23, aperture plate 24, supply plate 25, manifold plates 26, 27, and 28, cover plate 29, and nozzle plate 30 are laminated. Flow channel unit 4 is constructed from nine of the ten metallic plates, excluding actuator unit 21. As shown in FIG. 9, nozzle 8 is tapered. Nozzle 8 is linked to common ink chamber 5a through pressure chamber 10 and aperture 12. Within head base 70, a plurality of ink flow channels 32 is formed. Each ink flow channel 32 reaches nozzle 8 from an exit from common ink chamber 5a through aperture 12 and pressure chamber 10.

As shown in FIG. 8, the planar shape of pressure chamber 10 is approximately a rhombus. Aperture 12 links to one of the corners of the approximately rhombus-shaped pressure chamber 10, and nozzle 8 links to the other corner of pressure chamber 10.

As shown in FIG. 7, multiple ink supplying holes 4a are created on the top surface of flow channel unit 4. Ink supplying hole 4a is linked to common ink chamber 5a. As shown in FIG. 3, flow channel unit 4 is connected to aperture 3a created on the bottom surface of base block 91. Ink supplying hole 4a opens to apertures 3a. Ink sent to base block 91 is sent to common ink chamber 5a from ink supplying hole 4a.

In FIG. 8, depressions 10 (pressure chambers 9), apertures 12, and nozzles 8 located below actuator unit 21, which should have been drawn with dashed lines, have been drawn with solid lines to make the diagram easier to understand.

Figure 10:
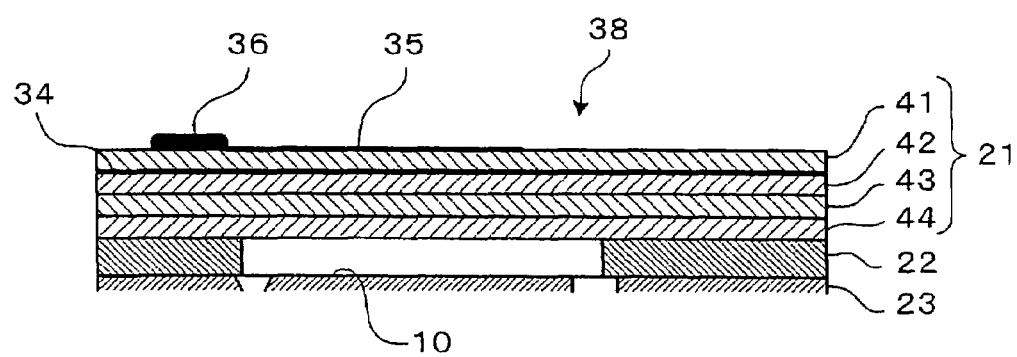
FIG. 10 (a) shows an enlarged cross-sectional diagram of an actuator unit and a pressure chamber, and FIG. 10 (b) shows a planar diagram representing the shape of an individual electrode formed on a top surface of the actuator unit.
Figure 10:
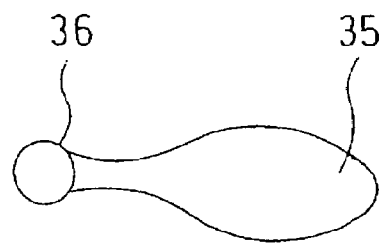

As shown in FIG. 10, actuator unit 21 is formed by laminating four piezoelectric sheets 41-44. FIG. 10(a) is an enlarged cross-sectional diagram of actuator unit 21 and pressure chamber 10, and FIG. 10(b) is a planar diagram that illustrates the shape of individual electrode formed on the top surface of actuator unit 21.

Actuator unit 21 includes four piezoelectric sheets 41, 42, 43, and 44, each formed to have a thickness of approximately 15 μm. These piezoelectric sheets 41-44 are shaped as continuous layers of flat plates (continuous flat plate layers), disposed so as to straddle the large number of pressure chambers 10 formed within the ink discharging region within head base 70. With the piezoelectric sheets 41-44 disposed as continuous flat plate layers straddling the large number of pressure chambers 10, it becomes possible to dispose individual electrode 35 very densely on top of piezoelectric sheet 41 by using, for example, screen printing technology. Therefore, it also becomes possible to dispose very densely pressure chambers 10 formed in the location where individual electrode 35 corresponds, and a high resolution image can be printed. Piezoelectric sheets 41-44 are made from ceramic material of a type of titanic acid lead zirconate with ferroelectric properties.

Electrodes 34 and 35 are formed on both top and bottom sides of top layer piezoelectric sheet 41, and when applying voltage to electrodes 34 and 35, an electric field is added to top layer piezoelectric sheet 41, and top layer piezoelectric sheet 41 changes shape. Top layer piezoelectric sheet 41 is an active layer of a piezoelectric effect. The remaining three piezoelectric sheets 42-44 are inactive layers.

Common electrode 34 with a thickness of approximately 2 μm is formed between a bottom surface of top layer piezoelectric sheet 41 and a top surface of piezoelectric sheet 42. On the top surface of top layer piezoelectric sheet 41, a plurality of individual electrodes 35 is formed. This individual electrode 35 and common electrode 34 are both made from such metallic materials as Ag—Pd.

Cavity plate 22 is a metallic plate that forms flow channel unit 4, and has a large number of rhombus-shaped openings, in which each opening forms depression 10.

Individual electrode 35 is approximately 1 μm thick, and as shown in FIG. 10(b), has an approximate planar shape of a rhombus, approximately equal in shape to pressure chamber 10 shown in FIG. 8. Protruded on one end of an acute angle section of the approximately rhombus-shaped individual electrode 35 is land section 36 of circular shape with a diameter of approximately 160 μm, electrically connected to individual electrode 35. Land section 36, for example, is made from gold including glass flits, and as shown in FIG. 10(a), is attached on the surface of the protruded section of individual electrode 35. These land sections 36 are connected by soldering to terminals 99α and 99β, which are formed on the end portions of first wirings 76α and 76β which are in turn formed on FPCs 50α and 50β. The detail of connection between terminals 99α and 99β and land sections 36 is disclosed in co-pending U.S. application Ser. No. 11/167,288 filed on Jun. 28, 2005 by the common assignee, the contents of which are hereby incorporated by reference into the present application.

Each one of individual electrodes 35 is disposed to correspond to each one of depressions 10. Whether or not to apply voltage to individual electrode 35 can be controlled independently of other individual electrodes 35.

Individual electrodes 35 are connected to driver ICs 65α and 65β through land sections 36 and first wirings 76α and 76β of FPCs 50α and 50β. Driver ICs 65α and 65β control whether or not to apply voltage for every individual electrode 35.

A single actuator unit 21 provides the same number of actuators 38 as the number of individual electrodes 35. Since driver ICs 65α and 65β control each individual electrode 35 independently, pressure of each pressure chamber 10 is independently controlled, and ink can be discharged from any selected nozzle 8.

Common electrode 34 is connected to ground in a region not shown in the figure. Accordingly, common electrode 34 maintains ground potential equally in regions that correspond to all pressure chambers 10.

Next, a driving method of actuator unit 21 will be discussed. The polarization direction of piezoelectric sheet 41 of actuator unit 21 is in the thick direction. In other words, actuator unit 21 is of a so-called unimorph construction with one piezoelectric sheet 41 of a top side (that is, away from pressure chamber 10) as an active layer and three piezoelectric sheets 42-44 of a bottom side (that is, near pressure chamber 10) as inactive layers. Therefore, when a driving signal is applied to a selected individual electrode 35, a portion of piezoelectric sheet 41 facing the selected individual electrode 35 changes in its thickness by a piezoelectric transversal effect. On the other hand, piezoelectric sheets 42-44 do not shrink on their own, for they are not influenced by the electric field. Therefore, a difference in distortion arises between upper layer piezoelectric sheet 41 and lower layers piezoelectric sheets 42-44, and actuator 38 with laminated piezoelectric sheets 41-44 changes shape as to form a convexity on the inactive layers side. The driving signal may be either positive or negative. At this time, as shown in FIG. 10(a), since a bottom surface of actuator 38 is fixed on a top surface of cavity plate 22 which partitions the pressure chambers 10, actuator 38 changes shape so as to form a convexity on the depression 10 side. For this reason, the volume of pressure chamber 10 that corresponds to the selected actuator 38 decreases, the pressure on ink increases, and discharge energy is applied to the ink within the selected pressure chamber. As a result, ink is discharged from the corresponding nozzle 8. Then, when individual electrode 35 and common electrode 34 are placed back in equal electric potential, piezoelectric sheets 41-44 suck in ink from the manifold 5 side because the sheets 41-44 return to their original shapes and the volume of pressure chamber 10 returns to its original volume.

Driver IC 65, which applies a driving signal to individual electrode 35, generates heat. According to combined circuit unit 55 of a first embodiment, heat generated by driver IC65 can be released to the exterior through heat dissipation region 66. Therefore, it becomes possible to cool driver IC 65 without setting up a separate heat sink. Since the heat sink is unnecessary, the miniaturization of inkjet printer 101 can be realized. Also, since heat dissipation region 66 is formed on sub printed circuit board 60, when dissipating the heat generated from driver IC 65 to sub printed circuit board 60 through heat dissipation region 66, it is difficult for the heat to transfer to driving signal generation circuit device 57 of main printed circuit board 58, and adverse effects are not exerted on driving signal generation circuit device 57.

With combined circuit unit 55 of the first embodiment, since heat generated from driver ICs 65α and 65β dissipate to a wide range on the outer surface of sub printed circuit board 60 through heat dissipation section 66, it is difficult for the heat generated by driver ICs 65α and 65β to be trapped within combined circuit unit 55. In addition, since driver ICs 65α and 65β are sandwiched between FPCs 50α and 50β and sub printed circuit board 60, the heat from driver Ics 65α and 65β can be released to the exterior through FPCs 50α and 50β.

Since heat dissipation region 66 of sub printed circuit board 60 provides thin films 67 and 68 and thermal via 69 that joins thin films 67 and 68, heat generated from driver ICs 65α and 65β transfers from thin film 67 to thin film 68, whereby the cooling efficiency of driver ICs 65α and 65β is increased. In addition, since sub printed circuit board 60 comprises thin films 84 and 85 joined to thermal via 69, the surface area of heat dissipation region 66 becomes larger. As a result, it becomes possible to cool driver ICs 65α and 65β rapidly. In addition, since thin films 84 and 85 are connected to ground, and driver ICs 65α and 65β are disposed on the inner sides of thin films 84 and 85, it becomes possible to shield driver ICs 65α and 65β. In other words, noise from the exterior headed towards driver ICs 65α and 65β can be cut off or absorbed by thin films 84 and 85.

In addition, since driver ICs 65α and 65β are attached to heat dissipation region 66 through adhesion layer 88, it becomes possible to cool driver ICs 65α and 65β rapidly.

In addition, since main printed circuit board 58 and sub printed circuit board 60 are detachably connected by male and female connectors 59 and 61, it becomes possible to separate sub printed circuit board 60 from main printed circuit board 58 with ease. As a result, when any of driver ICs 65α and 65β of FPCs 50α and 50β, or any of driving signal generation circuit devices 57 of main printed circuit board 58 malfunctions, it becomes possible to separate sub printed circuit board 60 and main printed circuit board 58 to exchange just one of the two with ease.

In addition, since driver ICs 65α and 65β of two FPCs 50α and 50β are thermally coupled to a single heat dissipation region 66 of a single sub printed circuit board 60, it becomes unnecessary to prepare the same number of sub printed circuit boards 60 as FPCs 50α and 50β. A relatively small number of sub printed circuit boards 60 will suffice. Because the four sub printed circuit boards 60 have the same construction, the number of components can be decreased. It becomes possible to control the inflation in manufacturing costs of combined circuit unit 55.

Even when the number of nozzles increases with higher resolution of an inkjet head, and a number of pressure chamber 10, individual electrode 35, and wires on wirings 75 and 76 of FPCs 50α and 50β correspondingly increase, it becomes possible to maintain the wiring pitch of wirings 95 and 96 of main printed circuit board 58 broadly because sub printed circuit board 60 is set up on combined circuit unit 55. This will be explained in reference to a transfiguration example in a sub printed circuit board shown in FIG. 11.

Figure 11:
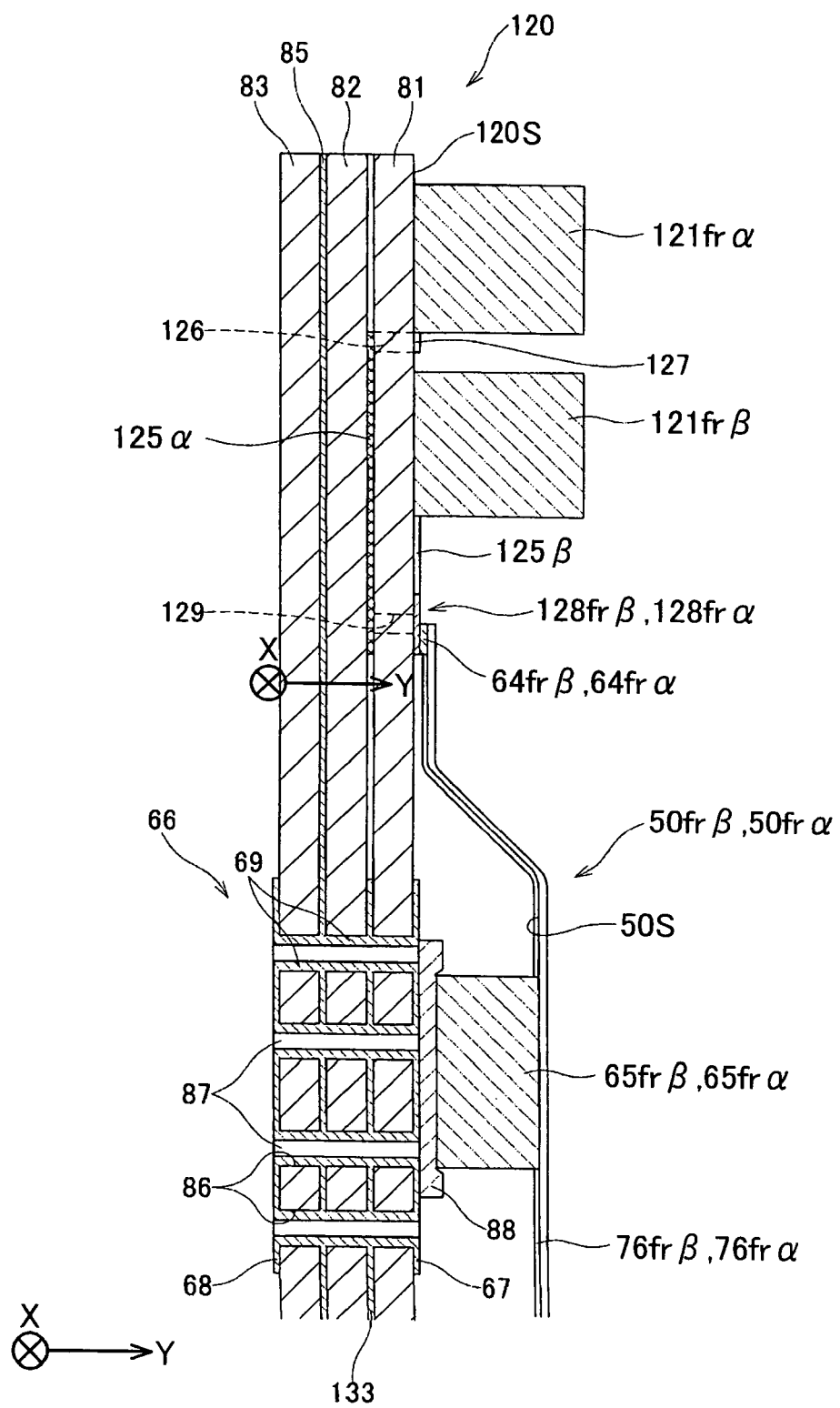
FIG. 11 shows an enlarged cross-sectional diagram of the transfiguration example of a sub printed circuit board included in the combined circuit unit of the first embodiment of the present invention.

FIG. 11 is an enlarged cross-sectional diagram showing the transfiguration example of the sub printed circuit board included in a combined circuit unit of the first embodiment. Materials equivalent to those already discussed above will be represented with the same symbols and their explanation will be omitted. On sub printed circuit board 120 of the present example are two male connectors 121α and 121 β disposed on the upper end of flat surface 120s which faces main printed circuit board 58. Each of male connectors 121α and 121β have the same shape as male connector 61 described above, and the number of terminals is cut approximately in half. In other words, the distance between the terminals of each of male connectors 121α and 121β is approximately twice the distance between the terminals of male connector 61 described above.

On flat surface 120s, which faces one end of FPCs 50α and 50β of sub printed circuit board 120, second terminals 128α and 128β are formed. Second terminals 128α and 128β are offset in the X direction.

Male connector 121α is electrically connected to wirings 125α, which have been disposed between sheet 81 and sheet 82, through conductor 127 that filles hole 126 penetrating in the thick direction of sheet 81. Second terminals 128α are electrically connected to the other end of wirings 125α, which have been disposed between sheet 81 and sheet 82, through a conductor that filles hole 129 penetrating in the thick direction of sheet 81. First terminals 64α of FPC 50α are connected to second terminals 128α by soldering.

Male connector 121β is electrically connected to wirings 125β, which have been formed on flat surface 120s of sub printed circuit board 120, and second terminals 128β is formed on the other end of wirings 125β. First terminals 64β of FPC 50β are connected to second terminals 128β by soldering.

In the description above, driver IC 65α is connected to main printed circuit board 58 through male connector 121α, and driver IC 65β is connected to main printed circuit board 58 through male connector 121β.

Sub printed circuit board 120 has the same laminated structure as sub printed circuit board 60 described above, but thin film 84 is not formed between sheet 81 and sheet 82, and thin film 133 is formed so as surround wirings 125α. Thin film 133 is isolated from wirings 125α. Thin film 133 is joined with thermal via 69 of heat dissipation region 66. Thin film 133 is connected to ground in a region not shown in the figure.

From such construction of sub printed circuit board 120, the wiring spacing between wirings to be connected to female connector 59 to be set up on main printed circuit board 58 can be made to be approximately twice the spacing compared to the one shown in FIG. 3. In other words, by using one male connector 121α for one FPC 50α, and using one male connector 121β for one FPC 50β, it becomes possible to expand the wiring spacing of wirings formed on main printed circuit board 58 to be connected to those female connectors, though two female connectors become necessary for main printed circuit board 58. Even if the number of wires that construct wirings of an FPC increases, the wiring spacing of the wirings of main printed circuit board 58 will not get smaller. In this way, by providing sub printed circuit board 120 to a combined circuit unit, the exchange of wiring pitch within the combined circuit unit can be done with ease. Consequently, there is more freedom in design. Put another way, by exchanging sub printed circuit board 60 with sub printed circuit board 120, the wiring spacing of wirings of main printed circuit board 58 can be expanded.

Figure 12:
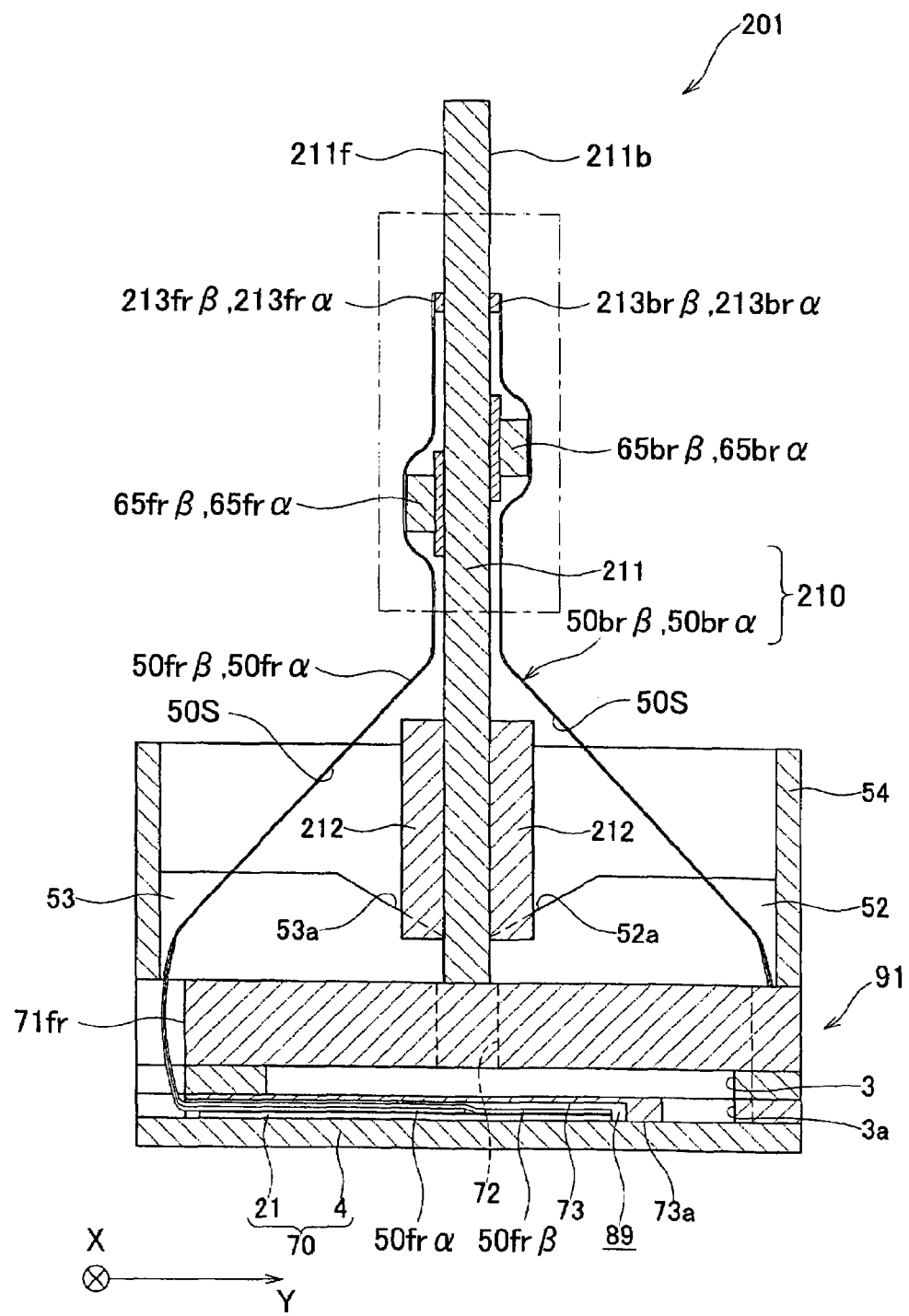
FIG. 12 shows a cross-sectional diagram of an inkjet head including a combined circuit unit of a second embodiment of the present invention.
Figure 13:
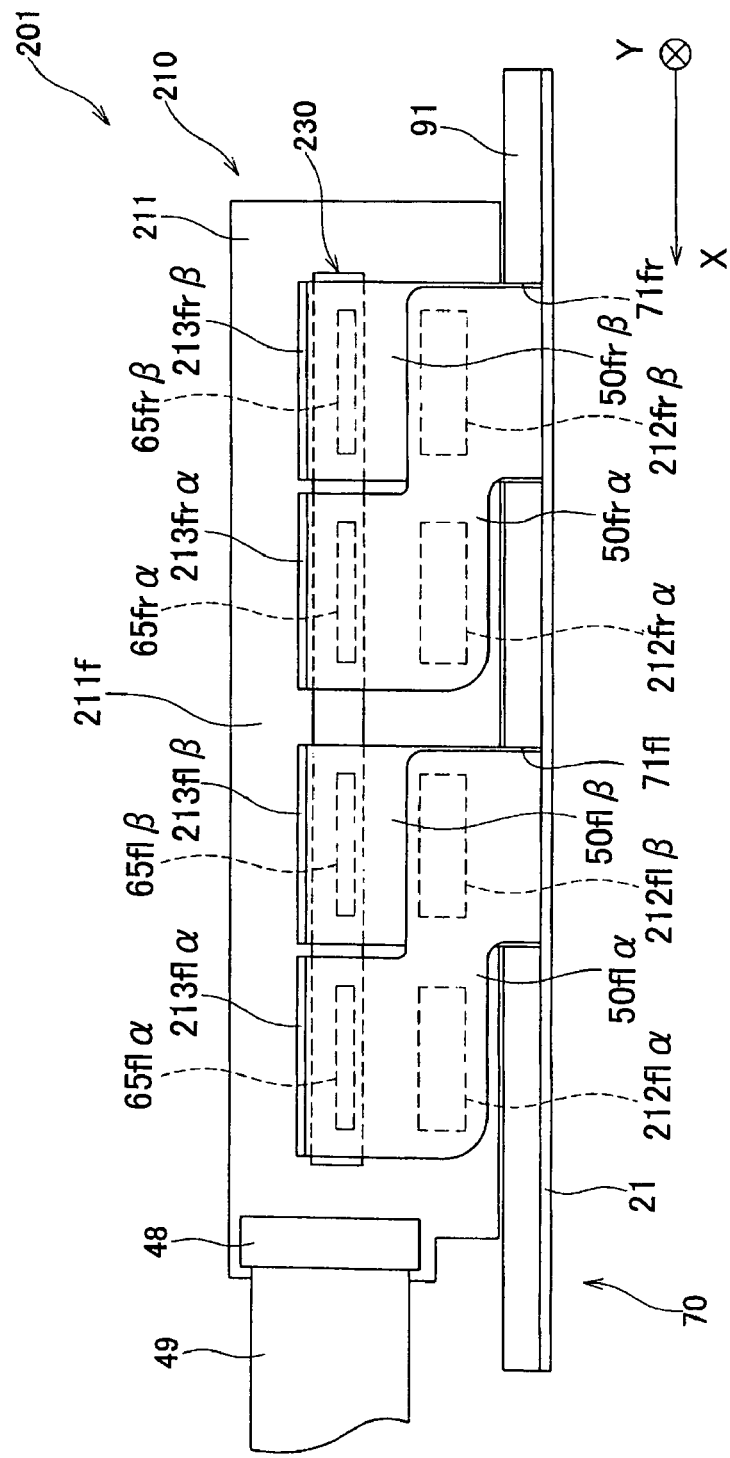
FIG. 13 shows a side diagram of the inkjet head shown in FIG. 12.
Figure 14:
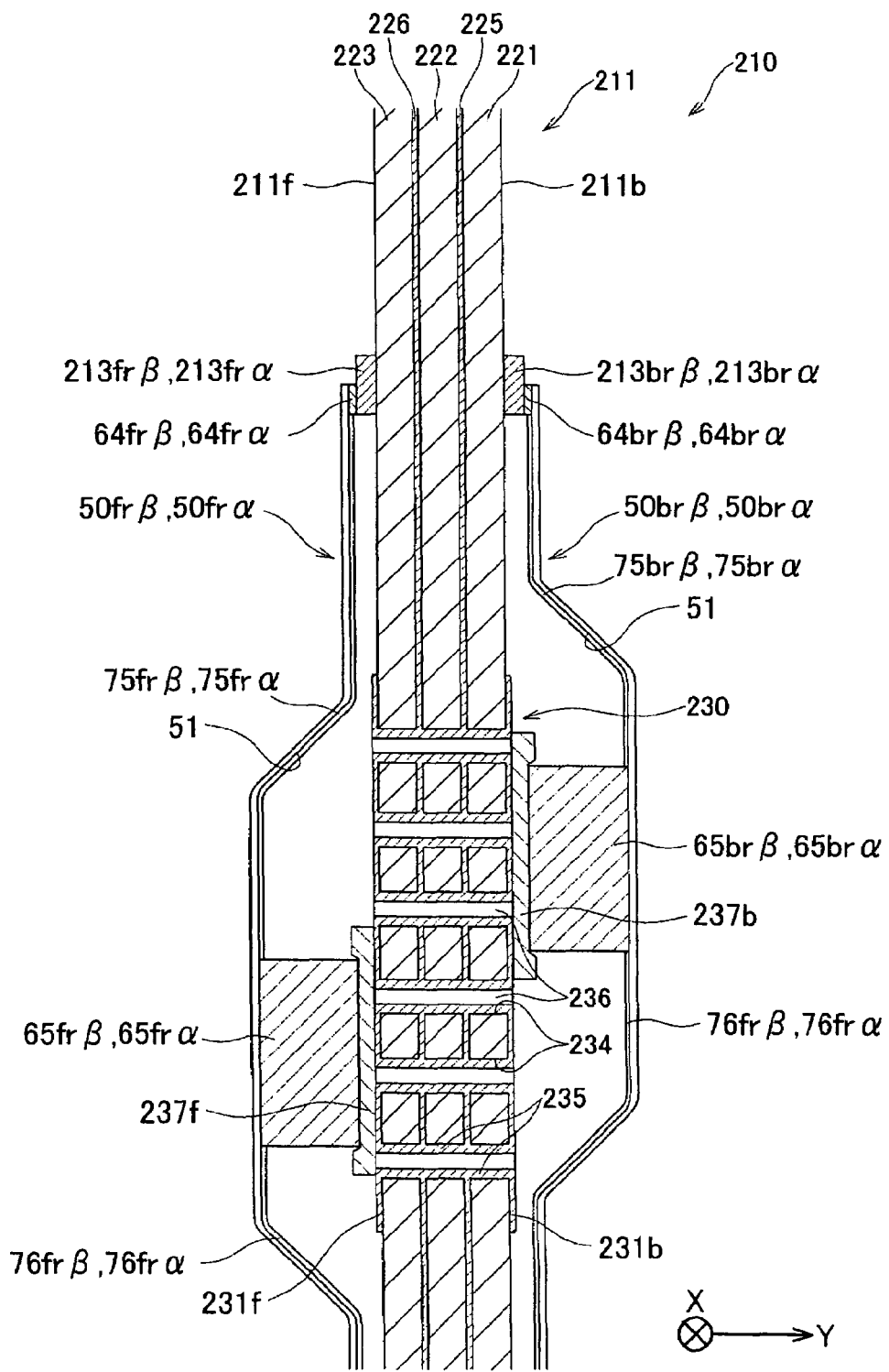
FIG. 14 shows an enlarged cross-sectional diagram of the area framed by the dashed lines shown in FIG. 12.

Next, inkjet head 201 including a combined circuit unit of a second embodiment will be explained. FIG. 12 is a cross-sectional diagram of inkjet head 201 including the combined circuit unit of the second embodiment of the present invention. FIG. 13 is a side diagram of inkjet head 201 shown in FIG. 12. FIG. 14 is an enlarged cross-sectional diagram of the area framed by the dashed lines shown in FIG. 12. Materials equivalent to inkjet head 1 of the first embodiment described above will be represented with the same symbols and their explanation will be omitted.

Inkjet head 201 of the present embodiment does not utilize sub printed circuit board 60 that inkjet head 1 of the first embodiment had utilized. In other words, Inkjet head 201, as shown in FIG. 12 and FIG. 13, provides head base 70, base block 91, combined circuit unit 210 including FPCs 50α and 50β and main printed circuit board 211, and cover 54 to support the bottom end portion of main printed circuit board 211.

Main printed circuit board 211 of combined circuit unit 210 has a rectangular shape long in the main scanning direction (X direction), short in the height direction and thin in Y direction, and its front surface 211f and back surface 211b are supported by cover 54 so as to be perpendicular to the top surface of base block 91.

As shown in FIG. 13, on front surface 211f of main printed circuit board 211, four driving signal generation circuit devices (second front electronic circuit device) 212flα, 212flβ, 212frα, and 212frβ are mounted and four second terminals 213flα, 213flβ, 213frα, and 213frβ are formed. Four second terminals 213flα, 213flβ, 213frα, and 213frβ are connected to four FPCs 50flα, 50flβ, 50frα, and 50frβ. First terminals 64 of FPC 50 and second terminals 213 of main printed circuit board 211 are securely connected by soldering.

On back surface 211b of main printed circuit board 211, four driving signal generation circuit devices (second back electronic circuit device) 212blα, 212blβ, 212brα, and 212brβ are mounted and four second terminals 213blα, 213blβ, 213brα, and 213brβ are formed. Four second terminals 213blα, 213blβ, 213brα, and 213brβ are connected to four FPCs 50blα, 50blβ, 50brα, and 50brβ. Driving signal generation circuit devices 212 and second terminals 213 are connected by wirings (not shown in the figure). The wirings are constructed from copper-foil.

Main printed circuit board 211, as shown in FIG. 14, has a laminated structure in which three sheets 221-223 of relatively rigid insulating material are laminated. Between each of sheets 221-223, thin films 225 and 226 made from copper are formed. Thin films 225 and 226 are formed to extend and span the entire surface of each of sheets 221-223 where the sheets face each other. Each of thin films 225 and 226 is connected to ground in a region not shown in the figure, and is maintained at ground potential.

In the middle region of main printed circuit board 211, heat dissipation region 230 which is long in the X direction is formed to face the eight driver ICs 65flα, 65flβ, 65frα, 65frβ, 65blα, 65blβ, 65brα, and 65brβ. Heat dissipation region 230 includes thin film 231f formed on front surface 211f of main printed circuit board 211, thin film 231b formed on back surface 211b of main printed circuit board 211, and thermal via 235 formed on inner walls of a plurality of holes 234 that penetrates in the thick direction of main printed circuit board 211. Even in the present embodiment, thin films 231f and 231b and thermal via 235 are constructed from copper. With respect to main printed circuit board 211, since wirings and thin films 231 and 232 are constructed from the same copper, it becomes possible to make the process to form the wirings and the process to form thin films 231 and 232 the same process. Therefore, manufacturing costs and manufacturing man-hours can be reduced. Thermal via 235 joins both thin films 231f and 231b and thin films 225 and 226 as to integrate them into one. Since each thermal via 235 is attached to the inner wall of hole 234, cavity 236 which penetrates into the thick direction of main printed circuit board 211 is formed inside of thermal via 235. In addition, gold coating is applied to the surface of thin films 231f and 231b and thermal via 235. As a result, heat transferred to thin films 231f or 231b is easily transferred to thin films 231b or 231f, which faces thin films 231f for 231b, through thermal via 235.

Driver ICs 65f and 65b equipped on surface 51 of FPCs 50f and 50b are attached to thin films 231f and 231b, respectively, through adhesion layers 237f and 237b composed of a two-sided tape. Adhesion layer 237f is disposed on the lower side section relative to the middle of thin film 231f, and covers a portion of an aperture of a plurality of holes 234. Adhesion layer 237b is disposed on the upper side section relative to the middle of thin film 231f and covers a portion of the aperture of a plurality of holes 234. In other words, driver ICs 65f and 65b, which are in a relatively close position, sandwiching main printed circuit board 211, are positioned out of alignment in the up-down direction and do not overlap. Accordingly, it becomes possible to release, from a region of thin film 231b on back surface 211b where driver IC 65b is not attached, the heat transferred from driver IC 65f attached to thin film 231f on front surface 211f through thermal via 235. In addition, it becomes possible to release, from a region of thin film 231f on front surface 211f where driver IC 65f is not attached, the heat transferred from driver IC 65b attached to thin film 231b on back surface 211b through thermal via 235. In other words, since driver IC 65f and driver IC 65b do not face each other across main printed circuit board 211, it becomes easier to release the heat generated by driver ICs 65f and 65b and cool driver ICs 65f and 65b rapidly.

As mentioned above, according to combined circuit unit 210 of a second embodiment, heat generated by driver ICs 65f and 65b of FPCs 50f and 50b can be released to the exterior through heat dissipation region 230. As a result, it becomes possible to cool driver ICs 65f and 65b without setting up a separate heat sink, and the miniaturization of an inkjet printer can be realized.

In addition, since driver ICs 65f and 65b are sandwiched between FPCs 50f and 50b and main printed circuit board 211, heat from driver ICs 65f and 65b become easier to release from heat dissipation region 230. Since heat dissipation region 230 of main printed circuit board 211 provides thin films 231f and 231b and thermal via 235 that joins thin films 231f and 231b, heat generated from driver ICs 65f and 65b transfers from either thin film 231f or thin film 231b to either thin film 231b or 231f, whereby the cooling efficiency of driver ICs 65f and 65b is increased. In addition, since main printed circuit board 211 includes thin films 225 and 226 joined to thermal via 235, the surface area of heat dissipation region 230 increases. As a result, it becomes possible to cool driver ICs 65f and 65b rapidly. In addition, since thin films 225 and 226 are maintained at ground potential and driver ICs 65f and 65b are disposed on the inner side of thin films 225 and 226, driver ICs 65f and 65b can be shielded. Further, it becomes possible to prevent noise generated from driver ICs 65f and 65b from transmitting to the main printed circuit board side. In other words, noise heading towards driver ICs 65f and 65b from the exterior, and noise generated from driver ICs 65f and 65b are cut off or absorbed by thin films 225 and 226.

In the inkjet head 201 described above, main printed circuit board 211 and FPCs 50f and 50b are connected by soldering, but a male connector may be set up on each of FPCs 50flα, 50flβ, 50frα, 50frβ, 50blα, 50blβ, 50brα, 50brβ, and eight female connectors may be set up on main printed circuit board 211. Accordingly, it becomes possible to separate FPC 50 from main printed circuit board 211 with ease. As a result, when either main printed circuit board 211 or FPC 50 malfunctions, it becomes easier to exchange just one of the two.

Figure 15:
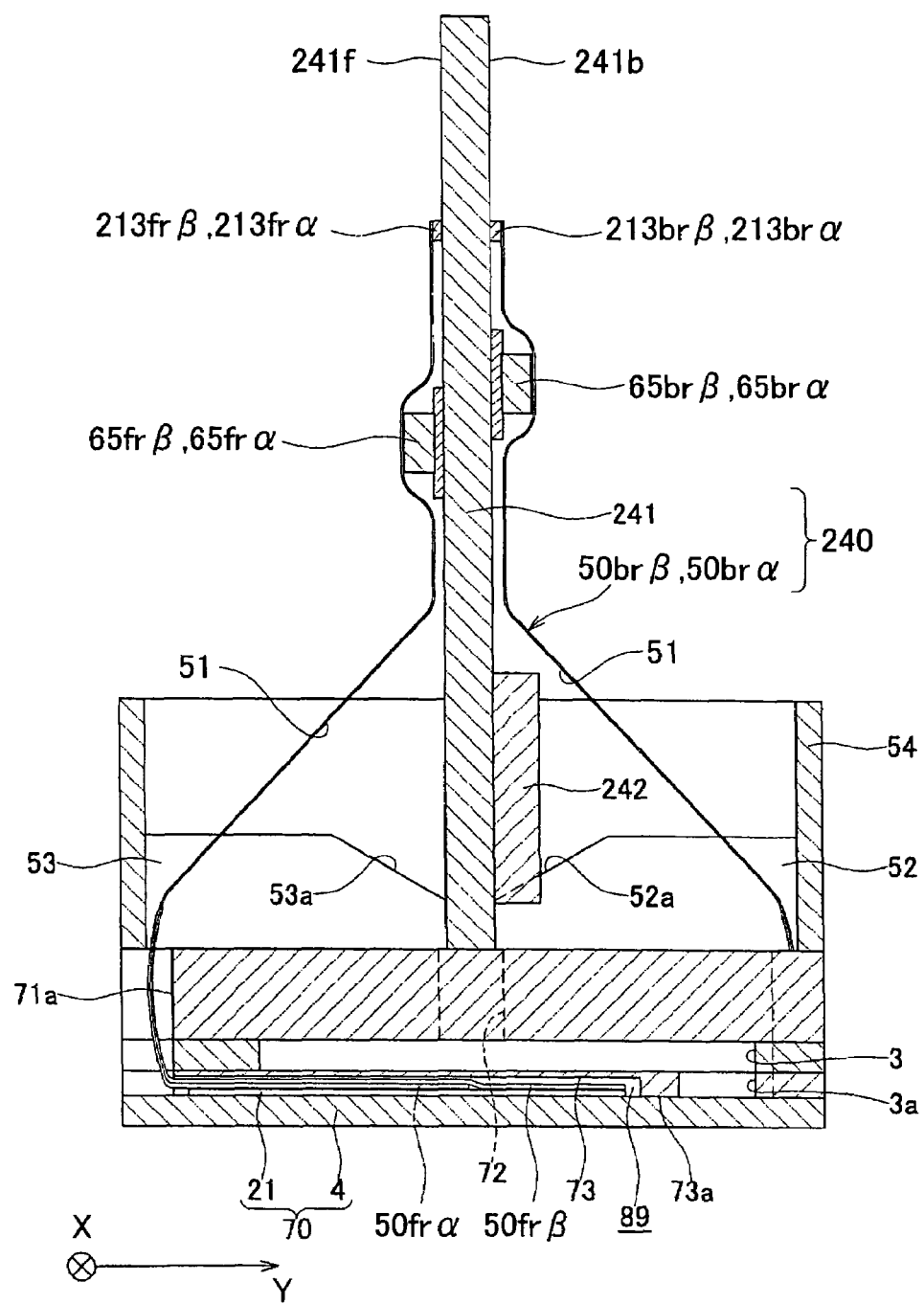
FIG. 15 shows a cross-sectional diagram of a transfiguration example of the combined circuit unit of the second embodiment of the present invention.

In addition, with respect to combined circuit unit 210 of a second embodiment, eight driving signal generation circuit devices 212 are set up on main printed circuit board 211 corresponding to each driver IC 65, but as shown in FIG. 15, just one driving signal generation circuit device 242 may be set up on main printed circuit board 241. FIG. 15 is a cross-sectional diagram of a transfiguration example of a combined circuit unit according to the second embodiment of the present invention. Materials equivalent to those already discussed above will be represented with the same symbols and their explanation will be omitted.

As shown in FIG. 15, combined circuit unit 240 according to the present example includes main printed circuit board 241 with one driving signal generation circuit device 242 to be electrically connected to driver ICs 65flα, 65flβ, 65frα, 65frβ, 65blα, 65blβ, 65brα, and 65brβ through FPC 50flα, FPC 50flβ, FPC 50frα, FPC 50frβ, FPC 50blα, FPC 50blβ, FPC 50brα, and FPC 50brβ. Other aspects have the same construction as combined circuit unit 210 described above.

A preferred embodiment of the present invention has been described, but the present invention is not limited to the embodiment described above, and various modifications are possible within the scope of the claims. For example, combined circuit units 55 and 230 of the first and second embodiment described above can be applied not only to inkjet printers, but to electrical equipment using electrical circuit devices such as driver ICs that dissipate heat.

In addition, combined circuit units 55 and 210 of the first and second embodiments described above may be disposed in any orientation as long as heat dissipation regions 66 and 230 and each of driver ICs 65α and 65β of FPCs 50α and 50β are thermally coupled. Also, heat dissipation regions 66 and 230 of the first and second embodiments may be those made from only thin film 67 and thin films 231f and 231b. In addition, only one set of holes 86 and 234 may be formed on heat dissipation regions 66 and 230, in which case a bigger aperture area is preferred.

In addition, two thin films 84 and 85 are set up between sheets of sub printed circuit board 60, but setting up thin films is not necessary, and either one or more than three thin films may be set up between the sheets. In addition, two thin films 225 and 226 are set up between sheets of main printed circuit board 211, but setting up thin films is not necessary, and either one or more than three thin films may be set up between the sheets. In addition, thin films 84, 85, 225, and 226 do not need to be connected to ground. In addition, driver ICs 65α and 65β do not need to be attached to thin films 67, 231f, and 231b, and may be separated from each other through a heat conducting member. Thin films 84, 85, 225, and 226 do not need to be constructed from the same materials as wirings formed on sub printed circuit board 60 and main printed circuit board 211. For instance, heat conducting thin films may be constructed from copper foils, and wirings formed on sub printed circuit board, and main printed circuit board may be constructed from a metal other than copper such as aluminum foils. Alternatively, heat conducting thin films may be constructed from aluminum foils and wirings may be constructed from a metal other than aluminum such as copper foils. The four sub printed circuit boards 60 do not need to be of the same construction.

In the present invention, it is preferred that a first electronic circuit device (driver IC) be interposed or sandwiched between FPC 50 and a rigid printed circuit board (sub printed circuit boards 60 and 120 and main printed circuit boards 210 and 241). As a result, heat generated from the first electronic circuit device becomes easier to dissipate.

In addition, in the present invention, with respect to a heat dissipation region of the rigid printed circuit board (sub printed circuit boards 60 and 120 and main printed circuit board 210), it is preferred that a first heat conducting thin film and a second heat conducting thin film be formed on a surface facing the first electronic circuit device as well as on a surface of the opposite side thereof, and that the first heat conducting thin film and the second heat conducting thin film be thermally coupled through a heat conducting member filled into a hole or a plurality of holes penetrating the rigid printed circuit board. Accordingly, it becomes possible to cool the first electronic circuit device effectively because heat generated from the first electronic circuit device transfers to the first and the second heat conducting thin films.

At this time, a single or a plurality of third heat conducting thin films that extend along the surface direction of a rigid printed circuit board (sub printed circuit boards 60 and 120 and main printed circuit board 210) and are thermally coupled to the heat conducting member may be disposed within the rigid printed circuit board. Accordingly, the surface area of the heat dissipation region becomes even larger. As a result, it becomes possible to cool the first electronic circuit device rapidly.

At this time, having at least one of the third heat conducting thin films maintained at ground potential is preferred. Accordingly, it becomes possible to shield the first electronic circuit device electrostatically.

The first electronic circuit device may be attached to the first heat conducting thin film through an adhesion layer. Accordingly, it becomes possible to cool the first electronic circuit device even more rapidly.

A first and a second heat conducting thin films may be made from the same metallic material as wirings formed on a rigid printed circuit board. Accordingly, when forming the wirings on the rigid printed circuit board, it becomes possible to form the first and the second heat conducting thin films with the same process. As a result, it becomes unnecessary to add a different process to form the first and the second heat conducting thin films, and manufacturing costs and manufacturing man-hours can be reduced.

It is preferred that the first terminals and second terminals be detachably connected by a pair of connectors equipped to each of the FPC and the rigid printed circuit board mentioned above. Accordingly, it becomes possible to separate the FPC and the rigid printed circuit board with ease. As a result, when either of the rigid printed circuit board or the FPC malfunctions, it becomes easier to exchange just one of the two.

First terminals and second terminals may be soldered. Accordingly, it becomes possible to securely and electrically connect a first electronic circuit device and a second electronic circuit device.

It is preferred that a second rigid printed circuit board, in effect, extends parallel with a first rigid printed circuit board, and that the FPC is wedged between the first rigid printed circuit board and the second rigid printed circuit board. According to this, when the first rigid printed circuit board is disposed on the outside relative to the second rigid printed circuit board, heat generated from a first electronic circuit device escapes to the exterior through a heat dissipation region. As a result, it becomes difficult for the released heat to become trapped internally. Therefore, it becomes possible to cool the first electronic circuit device rapidly.

It is preferred for the first electronic circuit device to be wedged between an FPC and a first rigid printed circuit board. As a result, it becomes easier to release the heat generated by the first electronic circuit device.

In addition, at this time, a plurality of a first electronic circuit device may be thermally coupled to a single or a plurality of the heat dissipation region formed on one of a second rigid printed circuit boards. Accordingly it becomes unnecessary to prepare the same number of FPCs as the second rigid printed circuit boards. As a result, the number of components can be decreased.

In addition, with respect to the present invention, a plurality of the first rigid printed circuit boards is provided, and it is preferred that this plurality of the first rigid printed circuit boards be formed as common members. Accordingly, even if multiple first rigid printed circuit boards are set up, it becomes possible to control the inflation in manufacturing costs.

In addition, with respect to the present invention, it is preferred that the plurality of actuators be constructed within one piezoelectric actuator unit that includes a piezoelectric sheet that straddles and extends across a plurality of the pressure chambers, a plurality of individual electrodes disposed in a location facing the plurality of pressure chambers on the piezoelectric sheets, and a common electrode that sandwich the piezoelectric sheet with the plurality of individual electrodes. A plurality of the FPCs is connected to one of the piezoelectric actuator units, wherein the plurality of the FPCs is connected to one of the first rigid printed circuit boards. Accordingly, it becomes possible to decrease the number of the first rigid printed circuit board with respect to the number of FPCs, and to maintain the wiring pitch of each FPC at comparatively wide value.

What is claimed is:

1. A combined circuit unit, comprising:
    a flexible printed circuit film, comprising:
        a first electronic circuit device mounted on a surface of the flexible printed circuit film; and
        first terminals formed at end portions of wirings connected to the first electronic circuit device; and
    a rigid printed circuit board, comprising:
        a second electronic circuit device mounted on a surface of the rigid printed circuit board;
        second terminals formed at end portions of wirings connected to the second electronic circuit device; and
        a heat dissipation region having higher heat dissipation efficiency than the surrounding area,
    wherein the first terminals and the second terminals are electrically connected; and the first electronic circuit device is thermally coupled to the heat dissipation region.

2. The combined circuit unit of claim 1, wherein the first electronic circuit device is sandwiched between the flexible printed circuit film and the rigid printed circuit board.

3. The combined circuit unit of claim 1, wherein the heat dissipation region of the rigid printed circuit board comprises:

a first heat conducting thin film formed on a surface of the rigid printed circuit board that faces the first electronic circuit device;
a second heat conducting thin film formed on the other surface of the rigid printed circuit board; and
a heat conducting member that penetrates the rigid printed circuit board and connects the first heat conducting thin film and the second heat conducting thin film.

4. The combined circuit unit of claim 3, wherein the rigid printed circuit board further comprises:
a third heat conducting thin film extending parallel to and within the rigid printed circuit board and contacting the heat conducting member.

5. The combined circuit unit of claim 4, wherein the third heat conducting thin film is maintained at ground potential.

6. The combined circuit unit of claim 3, wherein the first electronic circuit device is attached to the first heat conducting thin film through an adhesion layer.

7. The combined circuit unit of claim 3, wherein the first heat conducting thin film and the second heat conducting thin film are made of the same metallic material as the wirings formed on the rigid printed circuit board.

8. The combined circuit unit of claim 1, wherein the first terminals and second terminals are detachably connected by a pair of connectors, one of the connectors being placed on the flexible printed circuit film and the other of the connectors being placed on the rigid printed circuit board.

9. The combined circuit unit of claim 1, wherein the first terminals and second terminals are soldered.

10. A combined circuit unit, comprising:
a front flexible printed circuit film, comprising:
a first front electronic circuit device mounted on a surface of the front flexible printed circuit film; and
first front terminals formed at end portions of wirings connected to the first front electronic circuit device;
a back flexible printed circuit film, comprising:
a first back electronic circuit device mounted on a surface of the back flexible printed circuit film; and
first back terminals formed at end portions of wirings connected to the first back electronic circuit device; and
a rigid printed circuit board, comprising:
a second electronic circuit device mounted on a surface of the rigid printed circuit board;
second front terminals formed at end portions of wirings connected to the second electronic circuit device, wherein the second front terminals are formed on a surface of the rigid printed circuit board facing the front flexible printed circuit film;
second back terminals formed at end portions of wirings connected to the second electronic circuit device, wherein the second back terminals are formed on a surface of the rigid printed circuit board facing the back flexible printed circuit film; and
a heat dissipation region having higher heat dissipation efficiency than the surrounding area;
wherein the first front terminals and the second front terminals are electrically connected; the first back terminals and the second back terminals are electrically connected; the first front electronic circuit device is thermally coupled to the heat dissipation region; and the first back electronic circuit device is thermally coupled to the heat dissipation region, wherein a range in which the first front electronic circuit device is thermally coupled to the heat dissipation region and a range in which the first back electronic circuit device is thermally coupled to the heat dissipation region do not overlap in-plane of the rigid printed circuit board.

11. A combined circuit unit, comprising:
a front flexible printed circuit film, comprising:
a first front electronic circuit device mounted on a surface of the front flexible printed circuit film; and
first front terminals formed at end portions of wirings connected to the first front electronic circuit device;
a back flexible printed circuit film, comprising:
a first back electronic circuit device mounted on a surface of the back flexible printed circuit film; and
first back terminals formed at end portions of wirings connected to the first back electronic circuit device; and
a rigid printed circuit board, comprising:
a second front electronic circuit device mounted on a surface of the rigid printed circuit board;
second front terminals formed at end portions of wirings connected to the second front electronic circuit device, wherein the second front terminals are formed on a surface of the rigid printed circuit board facing the front flexible printed circuit film;
a second back electronic circuit device mounted on the surface of the rigid printed circuit board; and
second back terminals formed at end portions of wirings connected to the second back electronic circuit device; wherein the second back terminals are formed on a surface of the rigid printed circuit board facing the back flexible printed circuit film; and
a heat dissipation region having higher heat dissipation efficiency than the surrounding area;
wherein the first front terminals and the second front terminals are electrically connected; the first back terminals and the second back terminals are electrically connected; the first front electronic circuit device is thermally coupled to the heat dissipation region; and the first back electronic circuit device is thermally coupled to the heat dissipation region, wherein a range in which the first front electronic circuit device is thermally coupled to the heat dissipation region and a range in which the first back electronic circuit device is thermally coupled to the heat dissipation region do not overlap in-plane of the rigid printed circuit board.

12. A combined circuit unit, comprising:
a flexible printed circuit film, comprising:
a first electronic circuit device mounted on a surface of the flexible printed circuit film; and
first terminals formed at end portions of wirings connected to the first electronic circuit device;
a first rigid printed circuit board, comprising:
wirings connecting second terminals and third terminals formed on a surface of the first rigid printed circuit board;
a heat dissipation region having higher heat dissipation efficiency than the surrounding area; and
a second rigid printed circuit board, comprising:
a second electronic circuit device mounted on a surface of the second rigid printed circuit board;
fourth terminals formed at end portions of wirings connected to the second electronic circuit device; wherein the second rigid printed circuit board is bigger than the first rigid printed circuit board;
wherein the first terminals and the second terminals are electrically connected; the third terminals and the fourth terminals are electrically connected; and the first electronic circuit device is thermally coupled to the heat dissipation region.

13. The combined circuit unit of claim 12, wherein the first rigid printed circuit board and the second rigid printed circuit board extend substantially parallel with each other, and the flexible printed circuit film is interposed between the first rigid printed circuit board and the second rigid printed circuit board.

14. The combined circuit unit of claim 12, wherein the first electronic circuit device is sandwiched between the flexible printed circuit film and the first rigid printed circuit board.

15. The combined circuit unit of claim 12, wherein the heat dissipation region of the first rigid printed circuit board comprises:
    a first heat conducting thin film formed on a surface of the first rigid printed circuit board that faces the first electronic circuit device;
    a second heat conducting thin film formed on the other surface of the first rigid printed circuit board; and
    a heat conducting member that penetrates the first rigid printed circuit board and connects the first heat conducting thin film and the second heat conducting thin film.

16. The combined circuit unit of claim 15, wherein the first rigid printed circuit board further comprises:
    a third heat conducting thin film extending parallel to and within the first rigid printed circuit board and contacting the heat conducting member.

17. The combined circuit unit of claim 16, wherein the third heat conducting thin film is maintained at ground potential.

18. The combined circuit unit of claim 15, wherein the first electronic circuit device is attached to the first heat conducting thin film through an adhesion layer.

19. The combined circuit unit of claim 15, wherein the first heat conducting thin film and the second heat conducting thin film are made of the same metallic material as the wirings formed on the first rigid printed circuit board.

20. The combined circuit unit of claim 12, wherein the third terminals and fourth terminals are detachably connected by a pair of connectors, one of the connectors being placed on the first rigid printed circuit board and the other of the connectors being placed on the second rigid printed circuit board.

21. The combined circuit unit of claim 20, wherein a plurality of the first electronic circuit devices is thermally coupled to the heat dissipation region formed on the first rigid printed circuit board.

22. The combined circuit unit of claim 12, comprising a plurality of the first rigid printed circuit boards, wherein each of the first rigid printed circuit boards has a common shape.

23. An inkjet printer, comprising:
    an inkjet head, comprising:
        a flow channel unit, comprising:
            a common ink chamber;
            a plurality of pressure chambers;
            a plurality of nozzles; and
            a plurality of ink flow channels, wherein each ink flow channel reaches a single nozzle from the common ink chamber through a single pressure chamber; and
        a plurality of actuators, wherein each of the actuators gives discharge energy to the ink within each of the pressure chambers;
    a flexible printed circuit film, comprising:
        a driver IC which is mounted on a surface of the flexible printed circuit film and which generates signals to supply to the actuators; and
        first terminals formed at end portions of wirings connected to the driver IC and the actuators; and
    a rigid printed circuit board, comprising:
        a second electronic circuit device mounted on a surface of the rigid printed circuit board;
        second terminals formed at end portions of wirings connected to the second electronic circuit device; and
        a heat dissipation region having higher heat dissipation efficiency than the surrounding area,
    wherein the first terminals and the second terminals are electrically connected; and the driver IC is thermally coupled to the heat dissipation region.

24. The inkjet printer, comprising:
    an inkjet head, comprising:
        a flow channel unit, comprising:
            a common ink chamber;
            a plurality of pressure chambers;
            a plurality of nozzles; and
            a plurality of ink flow channels, wherein each ink flow channel reaches a single nozzle from the common ink chamber through a single pressure chamber; and
        a plurality of actuators, wherein each of the actuators gives discharge energy to the ink within each of the pressure chambers;
    a front flexible printed circuit film, comprising:
        a front driver IC which is mounted on a surface of the front flexible printed circuit film and which generates signals to supply to the actuators; and
        first front terminals formed at end portions of wirings connected to the actuators and the front driver IC;
    a back flexible printed circuit film, comprising:
        a back driver IC which is mounted on a surface of the back flexible printed circuit film and which generates signals to supply to the actuators; and
        first back terminals formed at end portions of wirings connected to the actuators and the back driver IC; and
    a rigid printed circuit board, comprising:
        a second electronic circuit device mounted on a surface of the rigid printed circuit board;
        second front terminals formed at end portions of wirings connected to the second electronic circuit device, wherein the second front terminals are formed on a surface of the rigid printed circuit board facing the front flexible printed circuit film;
        second back terminals formed at end portions of wirings connected to the second electronic circuit device, wherein the second back terminals are formed on a surface of the rigid printed circuit board facing the back flexible printed circuit film; and
        a heat dissipation region having higher heat dissipation efficiency than the surrounding area;
    wherein the first front terminals and the second front terminals are electrically connected; the first back terminals and the second back terminals are electrically connected; the front driver IC is thermally coupled to the heat dissipation region; and the back driver IC is thermally coupled to the heat dissipation region, wherein a range in which the front driver IC is thermally coupled to the heat dissipation region and a range in which the back driver IC is thermally coupled to the heat dissipation region do not overlap in-plane of the rigid printed circuit board.

25. The inkjet printer, comprising:
an inkjet head, comprising:
  a flow channel unit, comprising:
    a common ink chamber;
    a plurality of pressure chambers;
    a plurality of nozzles; and
    a plurality of ink flow channels, wherein each ink flow channel reaches a single nozzle from the common ink chamber through a single pressure chamber; and
  a plurality of actuators, wherein each of the actuators gives discharge energy to the ink within each of the pressure chambers;
  a front flexible printed circuit film, comprising:
    a front driver IC which is mounted on a surface of the front flexible printed circuit film and which generates signals to supply to the actuators; and
    first front terminals formed at end portions of wirings connected to the actuators and the front driver IC;
  a back flexible printed circuit film, comprising:
    a back driver IC which is mounted on a surface of the back flexible printed circuit film and which generates signals to supply to the actuators; and
    first back terminals formed at end portions of wirings connected to the actuators and the back driver IC;
  a rigid printed circuit board, comprising:
    a second front electronic circuit device mounted on a surface of the rigid printed circuit board;
    second front terminals formed at end portions of wirings connected to the second front electronic circuit device, wherein second front terminals are formed on a surface of the rigid printed circuit board facing the front flexible printed circuit film;
    a second back electronic circuit device mounted on the surface of the rigid printed circuit board;
    second back terminals formed at end portions of wirings connected to the second back electronic circuit device, wherein second back terminals are formed on a surface of the rigid printed circuit board facing the back flexible printed circuit film; and
    a heat dissipation region having higher heat dissipation efficiency than the surrounding area;
  wherein the first front terminals and the second front terminals are electrically connected; the first back terminals and the second back terminals are electrically connected; the front driver IC is thermally coupled to the heat dissipation region; and the back driver IC is thermally coupled to the heat dissipation region, wherein a range in which the front driver IC is thermally coupled to the heat dissipation region and a range in which the back driver IC is thermally coupled to the heat dissipation region do not overlap in-plane of the rigid printed circuit board.

26. The inkjet printer, comprising:
an inkjet head, comprising:
  a flow channel unit, comprising:
    a common ink chamber;
    a plurality of pressure chambers;
    a plurality of nozzles; and
    a plurality of ink flow channels, wherein each ink flow channel reaches a single nozzle from the common ink chamber through a single pressure chamber; and
  a plurality of actuators, wherein each of the actuators gives discharge energy to the ink within each of the pressure chambers;
  a flexible printed circuit film comprising:
    a driver IC which is mounted on a surface of the flexible printed circuit film and which generates signals to supply to the actuators; and
    first terminals formed at end portions of wirings connected to the driver IC and the actuators;
  a first rigid printed circuit board, comprising:
    wirings connecting second terminals and third terminals formed on a surface of the first rigid printed circuit board; and
    a heat dissipation region having higher heat dissipation efficiency than the surrounding area;
  a second rigid printed circuit board, comprising;
    a second electronic circuit device mounted on a surface of the second rigid printed circuit board; and
    fourth terminals formed at end portions of wirings connected to the second electronic circuit device, wherein the second rigid printed circuit board is bigger than the first rigid printed circuit board;
  wherein the first terminals and the second terminals are electrically connected; the third terminals and the fourth terminals are electrically connected; and the driver IC is thermally coupled to the heat dissipating region.

27. The inkjet printer of claim 26, wherein the plurality of the actuators comprises:
  a piezoelectric sheet that straddles and extends across a plurality of the pressure chambers;
  a plurality of individual electrodes disposed on the piezoelectric sheet at locations facing each of the plurality of the pressure chambers; and
  a common electrode that sandwiches the piezoelectric sheet with the plurality of individual electrodes;
wherein a plurality of the flexible printed circuit films is connected to the plurality of individual electrodes disposed on the single piezoelectric sheet, and the plurality of the flexible printed circuit films is connected to the single second rigid printed circuit board.

* * * * *